United States Patent
Oda

(10) Patent No.: US 9,525,422 B2
(45) Date of Patent: Dec. 20, 2016

(54) RECONFIGURABLE SEMICONDUCTOR INTEGRATED CIRCUIT AND ELECTRONIC DEVICE

(71) Applicant: KABUSHIKI KAISHA TOSHIBA, Toyko (JP)

(72) Inventor: Masato Oda, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/072,890

(22) Filed: Mar. 17, 2016

(65) Prior Publication Data

US 2016/0197615 A1 Jul. 7, 2016

Related U.S. Application Data

(63) Continuation of application No. PCT/JP2014/074327, filed on Sep. 12, 2014.

(30) Foreign Application Priority Data

Sep. 19, 2013 (JP) ................. 2013-194569

(51) Int. Cl.
*H03K 19/003* (2006.01)
*H03K 19/177* (2006.01)
(Continued)

(52) U.S. Cl.
CPC ....... *H03K 19/1776* (2013.01); *G11C 13/0069* (2013.01); *H03K 19/1737* (2013.01);
(Continued)

(58) Field of Classification Search
None
See application file for complete search history.

(56) References Cited

U.S. PATENT DOCUMENTS 6,573,748 B1 6/2003 Trimberger
6,924,663 B2 8/2005 Masui et al.
(Continued)

FOREIGN PATENT DOCUMENTS

JP 2003-198361 7/2003
JP 2005-332997 12/2005
(Continued)

OTHER PUBLICATIONS

International Search Report mailed Dec. 22, 2014, in counterpart International Application No. PCT/JP2014/074327 issued by the Japanese Patent Office; 2 pages.
(Continued)

*Primary Examiner* — Anh Tran
(74) *Attorney, Agent, or Firm* — Finnegan, Henderson, Farabow, Garrett & Dunner LLP

(57) ABSTRACT

According to an embodiment, a reconfigurable semiconductor integrated circuit includes memories connected in parallel, a logic circuit whose logic is defined according to data output of one of the memories, a signal output unit, and a switching unit. The signal output unit includes output terminals corresponding to the respective memories. Each terminal outputs a selection signal for enabling the data output or a non-selection signal for disabling the data output to the logic circuit. The signal output unit is configured to output the selection signal in a cyclic manner over the terminals so that one terminal outputs the selection signal and the others output the non-selection signal. The switching unit is configured to set a route between a first output terminal and a second output terminal of the terminals to an open state or a closed state. The route bypasses at least a single output terminal.

15 Claims, 19 Drawing Sheets

(51) Int. Cl.
*H03K 19/173* (2006.01)
*G11C 13/00* (2006.01)
*G11C 11/41* (2006.01)
*G11C 29/50* (2006.01)
*G11C 17/18* (2006.01)

(52) U.S. Cl.
CPC ........ *H03K 19/17728* (2013.01); *G11C 11/41* (2013.01); *G11C 17/18* (2013.01); *G11C 2029/5006* (2013.01)

(56) References Cited

U.S. PATENT DOCUMENTS

| | | | |
|---|---|---|---|
| 7,193,437 B2 | 3/2007 | Cappelli et al. | |
| 7,216,277 B1* | 5/2007 | Ngai | G11C 29/44 714/711 |
| 7,245,690 B2 | 7/2007 | Mutaguchi | |
| 7,317,331 B2 | 1/2008 | Teig et al. | |
| 7,408,382 B2 | 8/2008 | Schmit et al. | |
| 7,746,107 B1* | 6/2010 | Singh | H03K 19/17752 326/38 |
| 8,644,097 B2 | 2/2014 | Kono | |

FOREIGN PATENT DOCUMENTS

| | | |
|---|---|---|
| JP | 2007-329760 | 12/2007 |
| JP | 2011-160370 | 8/2011 |
| JP | 2013-30238 | 2/2013 |

OTHER PUBLICATIONS

Written Opinion mailed Dec. 22, 2014, in counterpart International Application No. PCT/JP2014/074327 issued by the Japanese Patent Office, 4 pages.

* cited by examiner

RECONFIGURABLE SEMICONDUCTOR INTEGRATED CIRCUIT AND ELECTRONIC DEVICE

CROSS-REFERENCE TO RELATED APPLICATION

This application is a continuation of PCT international Application Ser. No. PCT/JP2014/074327, filed on Sep. 12, 2014 which designates the United States, and which claims the benefit of priority from Japanese Patent Application No. 2013-194569, filed on Sep. 19, 2013; the entire contents of which are incorporated herein by reference.

FIELD

Embodiments described herein relate generally to a reconfigurable semiconductor integrated circuit and an electronic device.

BACKGROUND

An FPGA (Field-Programmable Gate Array) is a configurable integrated circuit (IC). Generally, an FPGA is configured by arranging basic tiles each of which includes a logic block (LB), which outputs basic logic information, and a switch block (SB), which connects with the LB in an arbitrary manner. Moreover, the circuitry configuring each block of an LB and an SB includes a configuration memory. Thus, if the contents stored in the configuration memories are rewritten, it is possible to implement the desired logic using the entire FPGA.

If it becomes possible to achieve a dynamic reconfigurable function in which rewriting with respect to the configuration memories is performed at a higher speed than the operation frequency of an FPGA, then a large logic that is originally calculated using a plurality of FPGAs can be calculated using only a single FPGA. In practice, from the perspective of the writing speed with respect to memory elements and the restrictions on the power consumption of memory elements, high-speed rewriting with respect to configuration memories is a difficult task to perform. In that regard, conventionally, a function equivalent to the dynamic reconfigurable function is implemented by installing a plurality of configuration memories, in which writing has been done in advance, in an FPGA and switching among the plurality of configuration memories is done at a higher speed than the operation frequency of the FPGA.

Typically, an SRAM (Static Random Access Memory) is often used as a configuration memory in an FPGA. An SRAM is configured with a CMOS (Complementary Metal Oxide Semiconductor), and can be adjusted for the gate length and the gate width so that the percent defective at the time of manufacturing can be held down. In contrast, regarding a nonvolatile memory having a different manufacturing process than an SRAM, although it is possible to hold the data without a continuous supply of electrical power, the percent defective of the memory is higher as compared to an SRAM.

In case there is a defect in a configuration memory of an FPGA, it is possible to think of destroying the entire chip. However, by taking into account the chip yield, even when a defect of some extent is present in a configuration memory of an FPGA, it is desirable to ensure that the overall operations of the FPGA are not affected.

DETAILED DESCRIPTION

According to an embodiment, a reconfigurable semiconductor integrated circuit includes a plurality of memories connected in parallel, a logic circuit, a signal output unit, and a switching unit. A logic of the logic circuit is defined according to data output of one of the memories. The signal output unit includes a plurality of output terminals corresponding to the respective memories. Each output terminal outputs either a selection signal for enabling the data output or a non-selection signal for disabling the data output to the logic circuit. The signal output unit is configured to output the selection signal in a cyclic manner over the output terminals so that one of the output terminals outputs the selection signal and the others output the non-selection signal. The switching unit is configured to set a route between a first output terminal of the output terminals and a second output terminal of the output terminals either to an open state or a closed state. The route bypasses at least a single output terminal.

First Embodiment

Figure 1:
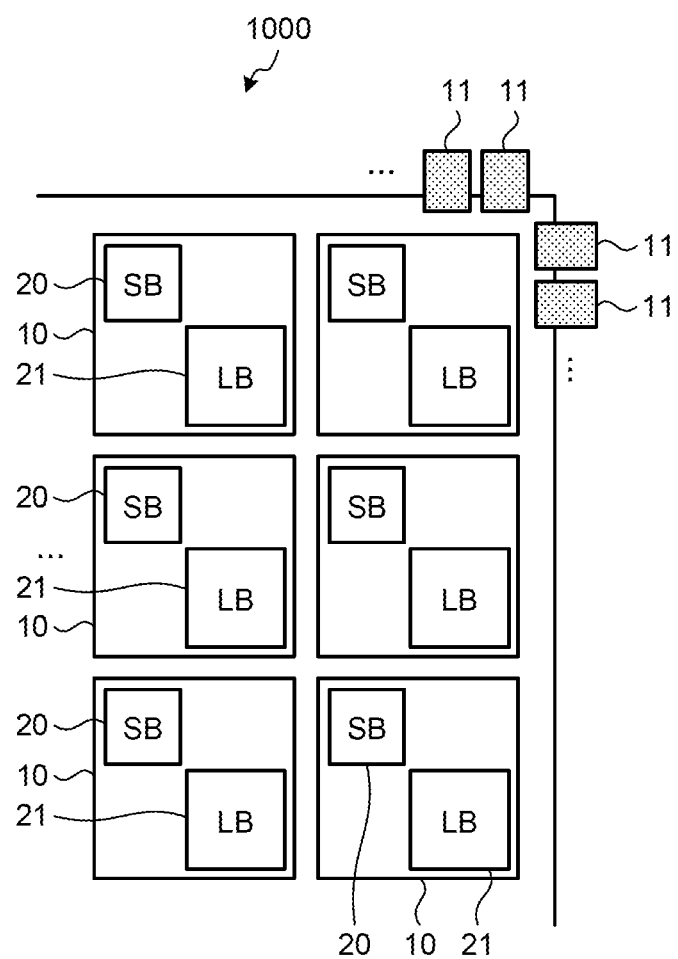
FIG. 1 is a block diagram that schematically illustrates an exemplary configuration of an FPGA.

Given below is the explanation of a reconfigurable semiconductor integrated circuit and an electronic device according to a first embodiment. In FIG. 1 is schematically illustrated an exemplary configuration of an FPGA (Field-Programmable Gate Array) functioning as a reconfigurable semiconductor integrated circuit. With reference to FIG. 1, an FPGA 1000 includes one or more basic tiles 10 and includes I/Os (Input/Output) 11 for connecting the basic tiles 10 to the outside of the FPGA 1000. Each basic tile 10 includes a switch block 20 (hereinafter, written as SB 20) and a logic block 21 (hereinafter, written as LB 21). The LB 21 implements basic logic information. The SB 20 connects with the corresponding LB 21 in an arbitrary manner.

Figure 2A:
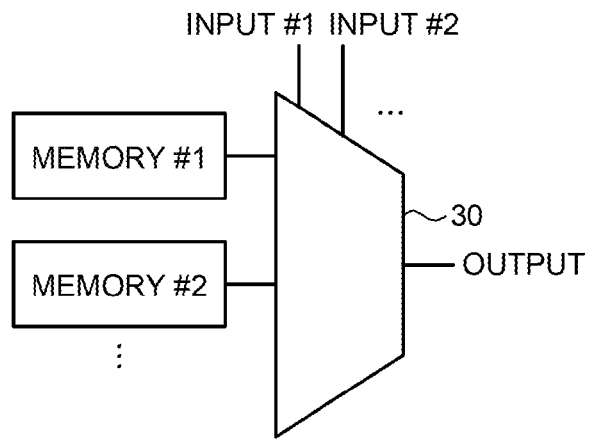
FIG. 2A is a diagram illustrating an exemplary circuit constituting an SB and an LB.
Figure 2B:
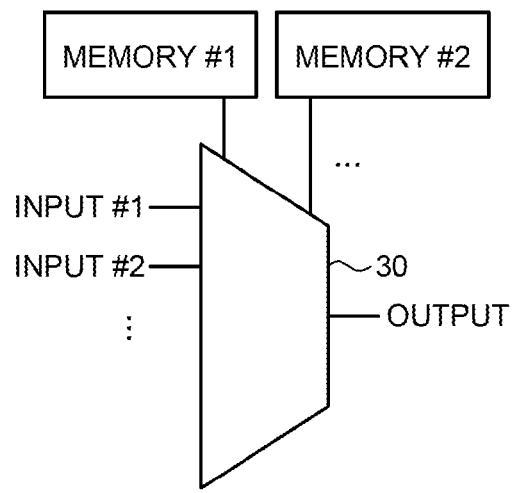
FIG. 2B is a diagram illustrating an exemplary circuit constituting an SB and an LB.
Figure 2C:
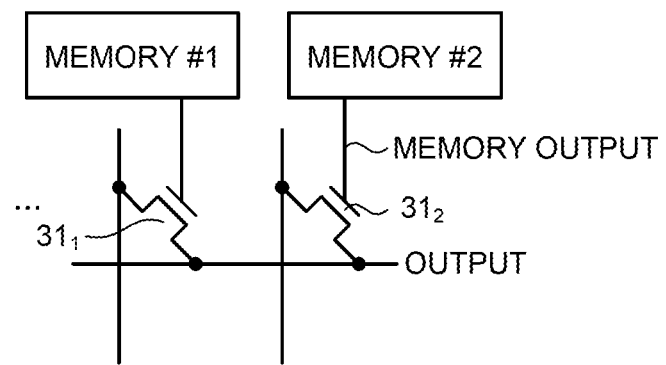
FIG. 2C is a diagram illustrating an exemplary circuit constituting an SB and an LB.

In FIG. 2A, FIG. 2B, and FIG. 2C are illustrated examples of circuits constituting the SB 20 and the LB 21. In FIG. 2A is illustrated an exemplary configuration of the LB 21 in which the output of one of memories #1, #2, and so on is selected and output using a selector 30 and according to inputs #1, #2, and so on. In FIG. 2B and FIG. 2C are illustrated exemplary configurations of the SB 20. In FIG. 2B is Illustrated an exemplary configuration of the SB 20 in which one of the inputs #1, #2, and so on selected and output using the selector 30 and according to the memories #1, #2, and so on. In FIG. 2C is illustrated an exemplary configuration of the SB 20. The output of the memories #1 and #2 is input to the gates of switching elements $31_1$ and $31_2$, respectively, so that the switching elements $31_1$ and $31_2$ are switched between open and closed states, and signals in accordance with the contents of the memories #1 and #2 are output.

In the following explanation, a switching element is assumed to be in the open state or the ON state when electricity is supplied thereto; and a switching element is assumed to be in the closed state or the OFF state when the supply of electricity is disconnected.

The memories #1, #2, and so on are called configuration memories. If the contents of the configuration memories #1, #2, and so on are rewritten, then an arbitrary logic can be implemented using the entire FPGA 1000.

If it becomes possible to achieve a dynamic reconfigurable function in which the contents of the configuration memories #1, #2, and so on are rewritten at a higher speed than the operation frequency of the processing system including the FPGA 1000, then a large logic that is usually calculated using a plurality of FPGAs 1000 can be calculated using only a single FPGA. However, from the perspective of the writing speed and the power consumption, high-speed rewriting with respect to configuration memories is a difficult task to perform even if SRAMs (Static Random Access Memory) having a high rewriting speed are used.

Figure 3A:
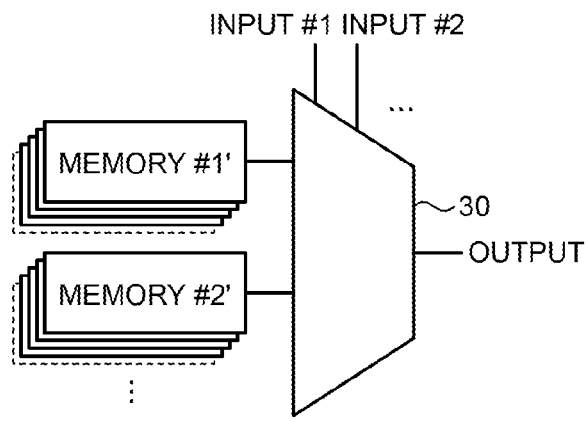
FIG. 3A is a diagram illustrating, according to a first embodiment, an exemplary circuit constituting an SB and an LB in the case when a multi-context technology is implemented.
Figure 3B:
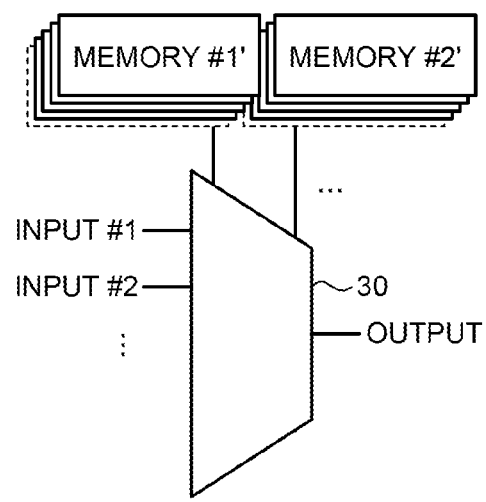
FIG. 3B is a diagram illustrating, according to the first embodiment, an exemplary circuit constituting an SB and an LB in the case when a multi-context technology is implemented.
Figure 3C:
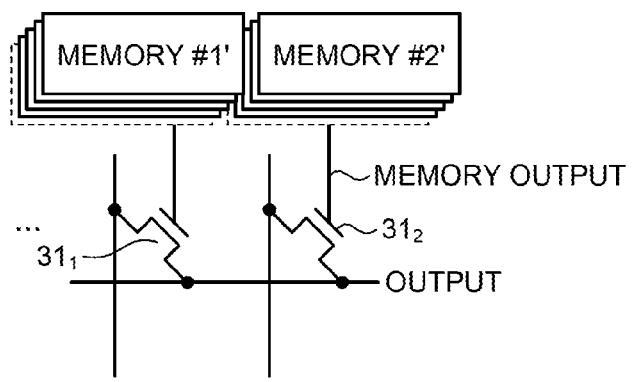
FIG. 3C is a diagram illustrating, according to the first embodiment, an exemplary circuit constituting an SB and an LB in the case when a multi-context technology is implemented.

In that regard, as illustrated in FIG. 3A, FIG. 3B, and FIG. 3C; for example, a multi-context technology is known in which the configuration memory #1' is configured with a plurality of configuration memories that is used by switching among themselves. In such a configuration, a function equivalent to the dynamic reconfigurable function can be implemented when switching among the configuration memories in each of the configuration memories #1', #2', and so on is performed at a higher speed than the operation frequency. This multi-context technology is implemented in the FPGA according to the first embodiment.

Figure 4:
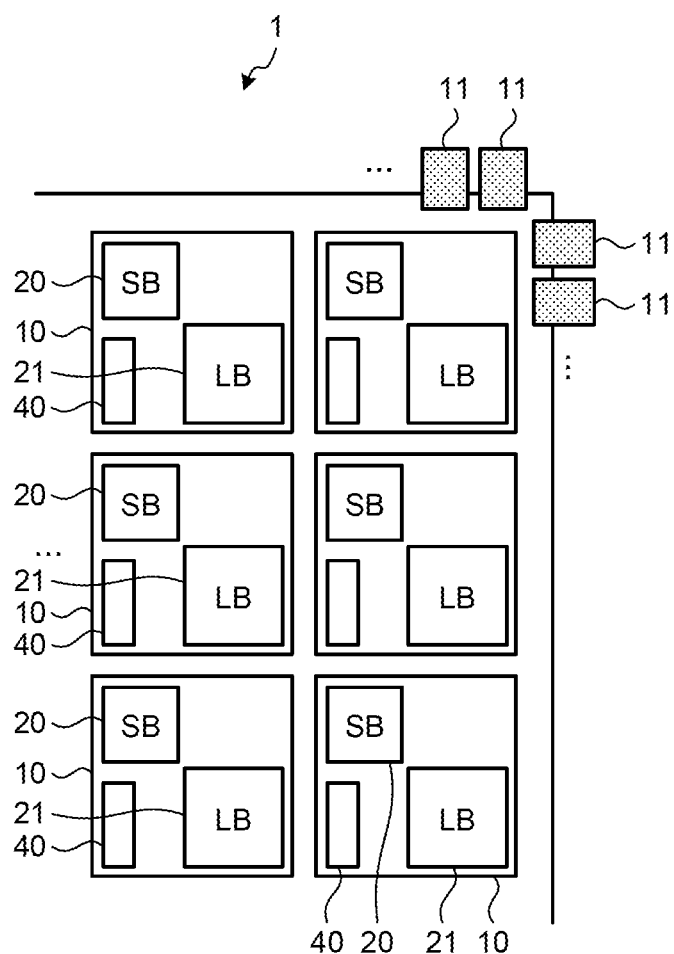
FIG. 4 is a block diagram that schematically illustrates an exemplary configuration of an FPGA which can be implemented in the first embodiment.

In FIG. 4 is schematically illustrated an exemplary configuration of an FPGA in which the multi-context technology is used and which can be implemented in the first embodiment. With reference to FIG. 4, as compared to the FPGA 1000 described above, an FPGA 1 according to the first embodiment includes the basic tiles 10 each of which further includes a memory switching circuit 40 for switching among a plurality of configuration memories present in the configuration memory #1'.

In the following explanation, for example, a single configuration memory #1' that is configured with a plurality of configuration memories is called a multi-configuration memory #1'.

Figure 5:
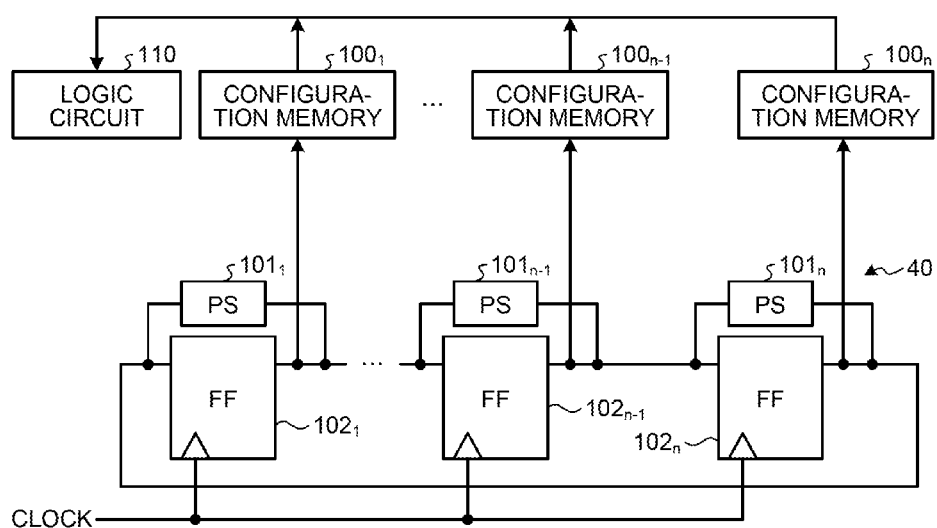
FIG. 5 is a block diagram illustrating an exemplary configuration of a memory switching circuit according to the first embodiment.

Given below is the detailed explanation of the FPGA 1 according to the first embodiment. In FIG. 5 is illustrated an exemplary configuration of the memory switching circuit 40 according to the first embodiment. With reference to FIG. 5, a plurality of configuration memories $100_1, \ldots, 100_{n-1}$, and $100_n$ that constitutes a single multi-configuration memory is arranged in parallel with respect to a logic circuit 110. By taking into account the redundancy, it is desirable to have a greater number of configuration memories $100_1, \ldots, 100_{n-1}$, and $100_n$ than the required number.

When a selection signal is sent to any of the configuration memories $100_1, \ldots, 100_{n-1}$, and $100_n$ from a shift resistor circuit (described later), the concerned configuration memory outputs the stored data to the logic circuit 110. Moreover, when a non-selection signal is sent to any of the configuration memories $100_1, \ldots, 100_{n-1}$, and $100_n$ from the shift resistor circuit, the concerned configuration memory closes the output. The logic circuit 110 performs operations using the data output by the configuration memories $100_1, \ldots, 100_{n-1}$, and $100_n$.

Meanwhile, the logic circuit 110 can be configured with a transistor, or can be an inverter circuit or a buffer circuit. Moreover, the transistor constituting the logic circuit 110 can be an n-type MOS (Metal-Oxide-Semiconductor) transistor or a p-type MOS transistor. Furthermore, the connection destination for the memory output can be a gate or can be a source/drain.

With reference to FIG. 5, the shift register circuit is configured by connecting a plurality of flip-flop (FF) circuits $102_1, \ldots, 102_{n-1}$, and $102_n$ in series. The output of the FF circuits $102_1, \ldots, 102_{n-1}$, and $102_n$ is sent as a selection signal or a non-selection signal to the configuration memories $100_1, \ldots, 100_{n-1}$, and $100_n$, respectively.

The shift register circuit is reset by a reset signal (not illustrated). From among the outputs of the FF circuits $102_1, \ldots, 102_{n-1}$, and $102_n$; a single output is treated as the selection signal, while the other outputs are treated as the non-selection signals. Thereafter, the outputs undergo transition according to a clock, and the selection signal and the non-selection signals are output from the FF circuits $102_1, \ldots, 102_{n-1}$, and $102_n$ in a cyclic manner.

With reference to FIG. 5, nonvolatile programmable switches (hereinafter, written as PSs) $101_1, \ldots, 101_{n-1}$, and $101_n$ are connected in between the outputs of the FF circuits $102_1, \ldots, 102_{n-1}$, and $102_n$. The PSs $101_1, \ldots, 101_{n-1}$, and $101_n$ store therein either the open state or the closed state.

That is, each of PSs $101_1, \ldots, 101_{n-1}$, and $101_n$ is disposed in between the output terminal of an FF circuit constituting the shift register circuit and the input terminal of the FF circuit that is reached in a cyclic manner after skipping one FF circuit from the concerned output terminal, in other words, the input terminal of the FF circuit present two places ahead of the concerned output terminal. When each of the PSs $101_1, \ldots, 101_{n-1}$, and $101_n$ switches to the closed state, the corresponding FF circuit from among the FF circuits $102_1, \ldots, 102_{n-1}$, and $102_n$ is skipped.

Herein, although the explanation is given for an example in which a PS is disposed in between the output terminal of an FF circuit constituting the shift register circuit and the output terminal of the FF circuit that is reached in a cyclic manner after skipping at least one FF circuit from the concerned output terminal, it is not the only possible case. Alternatively, for example, a PS can be disposed in between the output terminal of an FF circuit constituting the shift register circuit and the output terminal of the FF circuit that is reached in a cyclic manner after skipping two or more FF circuits from the concerned output terminal.

Figure 6:
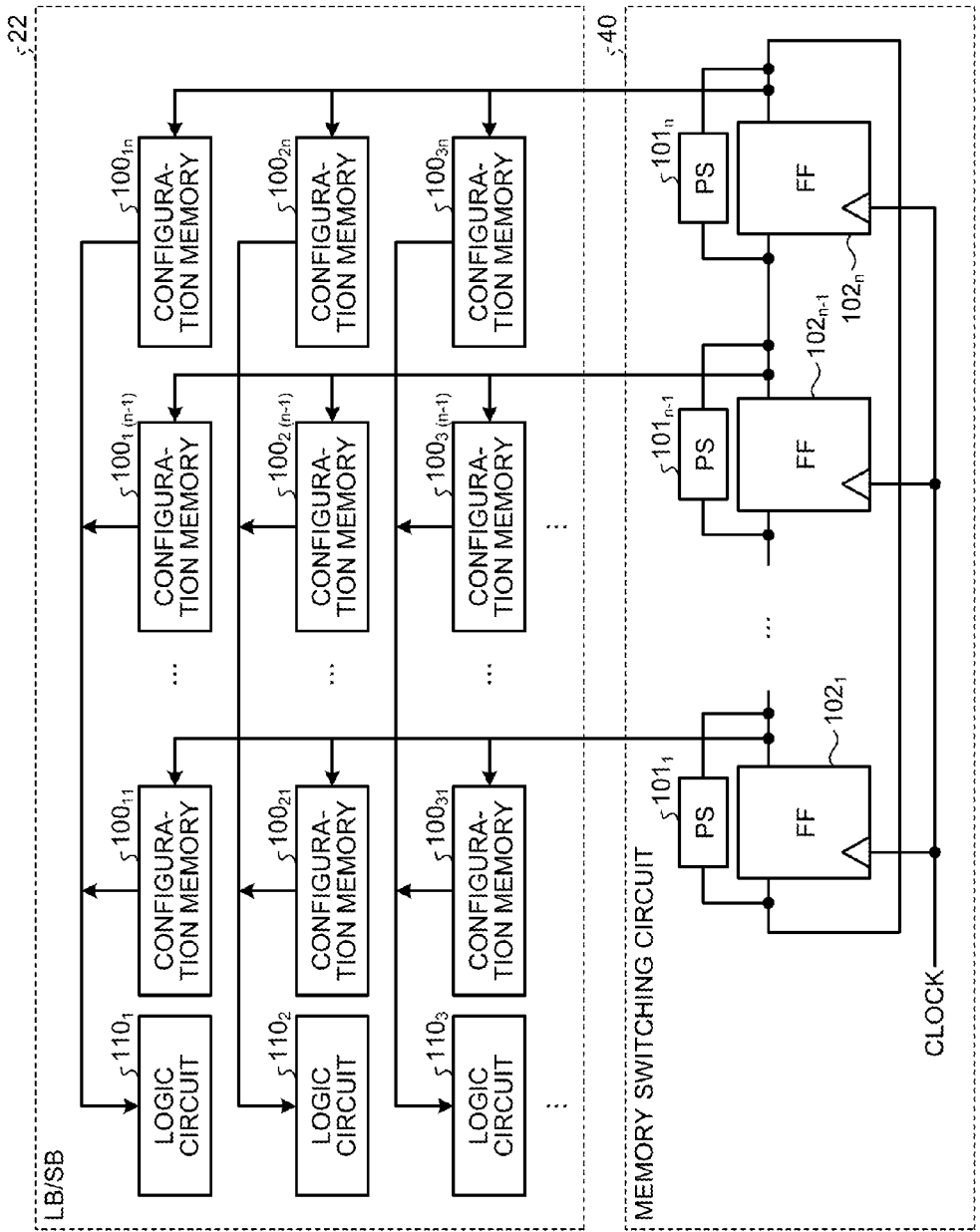
FIG. 6 is a diagram illustrating an exemplary relationship of the SB and the LB with the memory switching circuit according to the first embodiment.

In FIG. 5, it is illustrated that a single multi-configuration memory is connected to the memory switching circuit. However, in practice, in the SB 20 and the LB 21, a plurality of sets of a multi-configuration memory and the logic circuit 110 is included. In FIG. 6 is illustrated an exemplary relationship of the SB 20 and the LB 21 with the memory switching circuit 40. In FIG. 6, the SB 20 and the LB 21 are collectively illustrated as an LB/SB block 22. Moreover, in FIG. 6, the common portion with FIG. 5 is referred to by the same reference numerals, and the detailed explanation is not repeated.

With reference to FIG. 6, in an identical manner to the example illustrated in FIG. 5, the memory switching circuit 40 includes a shift register circuit configured with the FF circuits $102_1, \ldots, 102_{n-1}$, and $102_n$; and includes the programmable switches $101_1, \ldots, 101_{n-1}$, and $101_n$ corresponding to the FF circuits $102_1, \ldots, 102_{n-1}$, and $102_n$, respectively.

The LB/SB block 22 includes a plurality of logic circuits $110_1, 110_2, 110_3$, and so on; and includes a plurality of multi-configuration memories corresponding to the logic circuits $110_1, 110_2, 110_3$. In the example illustrated in FIG. 6, configuration memories $100_{11}, \ldots, 100_{1(n-1)}$, and $100_{1n}$ are arranged in series with respect to the logic circuit $110_1$. In an identical manner, configuration memories $100_{21}, \ldots, 100_{2(n-1)}$, and $100_{2n}$ are arranged in series with respect to the logic circuit $110_2$. Moreover, configuration memories $100_{31}, \ldots, 100_{3(n-1)}$, and $100_{3n}$, are arranged in series with respect to the logic circuit $110_3$.

The output of each of the FF circuits $102_1, \ldots, 102_{n-1}$, and $102_n$ of the memory switching circuit 40 is sent to configuration memories across a plurality of multi-configuration memories. In the example illustrated in FIG. 6, the output of the FF circuit $102_1$ is sent to the configuration memories $100_{11}, 100_{21}, 100_{31}$, and so on. In an identical manner, the output of the FF circuit $102_{n-1}$ is sent to the configuration memories $100_{1(n-1)}, 100_{2(n-1)}, 100_{3(n-1)}$, and so on.

Figure 7:
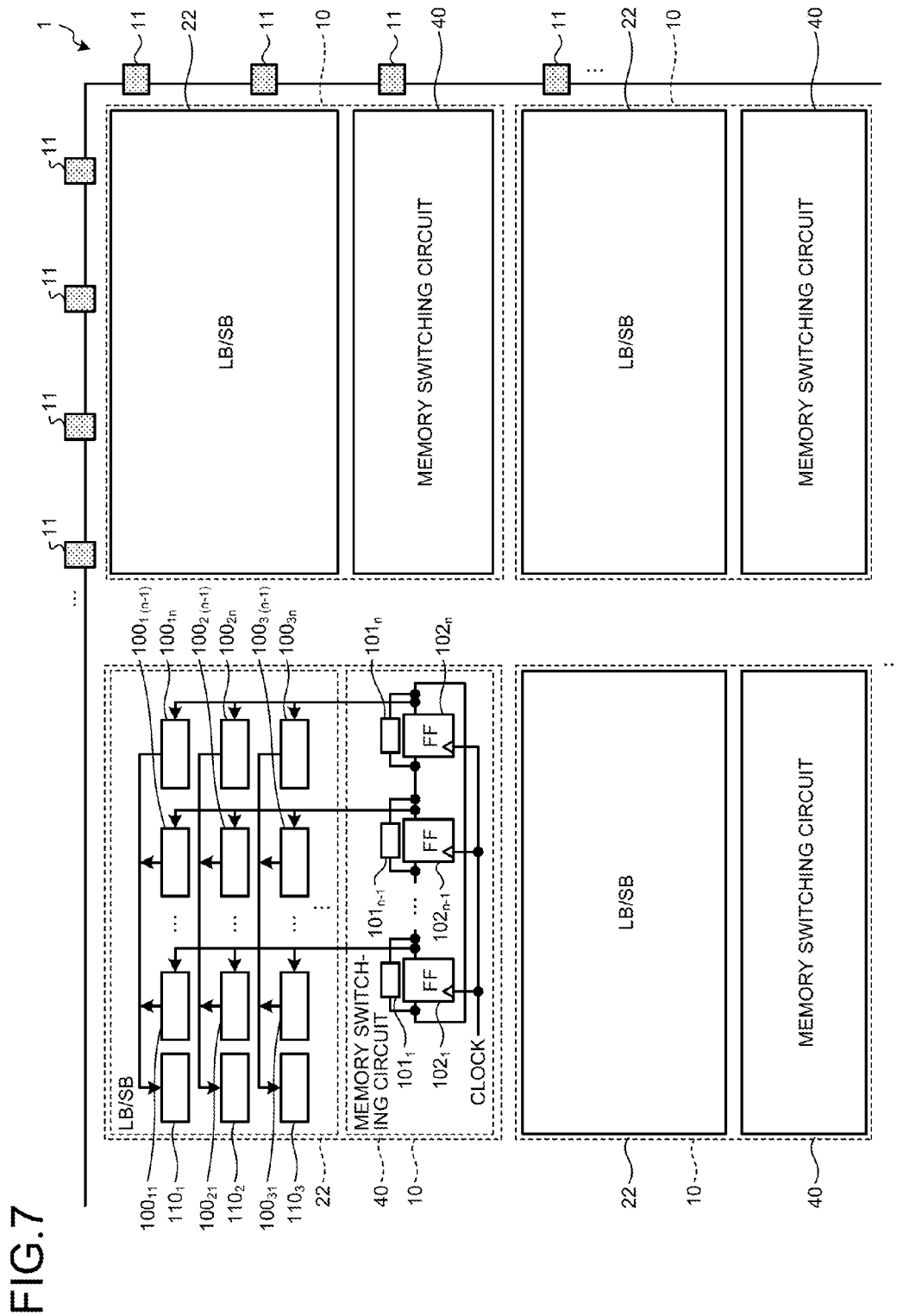
FIG. 7 is a diagram illustrating an exemplary arrangement of LB/SB blocks and the memory switching circuits in an entire FPGA according to the first embodiment.

In FIG. 7 is illustrated an exemplary arrangement of the LB/SB blocks 22 and the memory switching circuits 40 in the entire FPGA 1. In FIG. 7, the common portion with FIG. 5 and FIG. 6 is referred to by the same reference numerals, and the detailed explanation is not repeated. In the example illustrated in FIG. 7, a single LB/SB block 22 and a single memory switching circuit 40 constitute a single basic tile 10. Herein, each LB/SB block 22 may include a plurality of SBs 20 and LBs 21. The FPGA 1 is configured by arranging a plurality of basic tiles 10.

Figure 8:
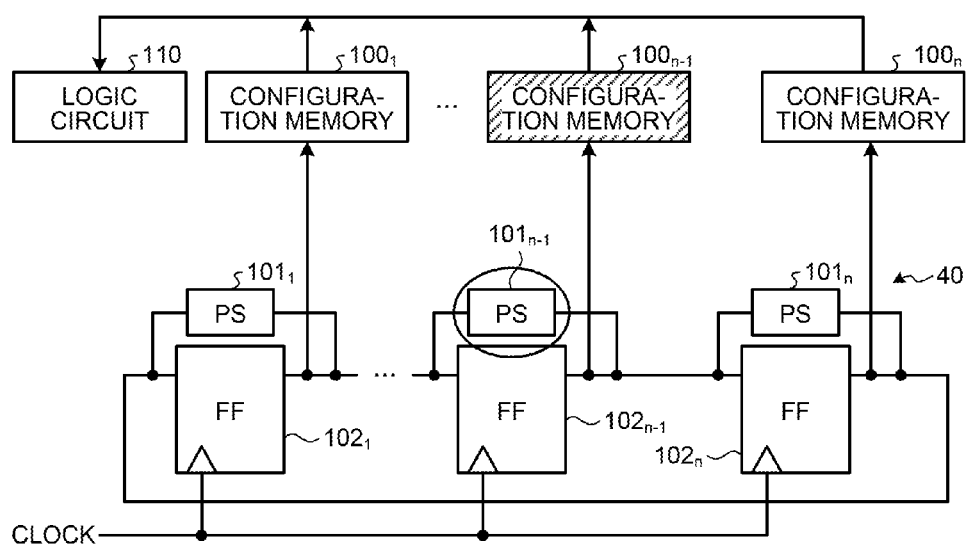
FIG. 8 is a diagram illustrating an example of the operations performed according to the first embodiment.

Given below is the explanation of the operations performed according to the first embodiment. In FIG. 8 is illustrated an example of the operations performed according to the first embodiment in the case in which, in the configuration illustrated in FIG. 5, a configuration memory included in a multi-configuration memory is defective. With reference to FIG. 8, it is assumed that the configuration memory $100_{n-1}$ is defective. In this case, the programmable switch $101_{n-1}$, which corresponds to the FF circuit $102_{n-1}$ that outputs a selection signal and a non-selection signal to the defective configuration memory $100_{n-1}$, is s itched to the closed state; and the output of the FF circuit $102_{n-1}$ is skipped. As a result, no selection signal and no non-selection signal is output to the configuration memory $100_{n-1}$.

For that reason, the data of the defective configuration memory $100_{n-1}$ is not sent to the logic circuit 110, thereby enabling prevention of malfunctioning of the logic circuit 110.

Consider a case in which the situation explained above is applied to the examples illustrated in FIG. 6 and FIG. 7. In the example illustrated in FIG. 6, if the configuration memory $100_{21}$ is defective, then the programmable switch $101_1$ is set to the closed state. Therefore, no selection signal and no non-selection signal is output to the configuration memories $100_{11}, 100_{21}, 100_{31}$, and so on to which the output of the FF circuit $102_1$ is connected in common. Hence, regardless of the fact that the configuration memories $100_{11}, 100_{31}$, and so on are operating normally, no selection signal and no non-selection signal is output thereto.

As illustrated in FIG. 7, since each basic tile 10 includes the memory switching circuit 40, the defect in a configuration memory in one of the basic tiles 10 is prevented from affecting the other basic tiles 10.

Meanwhile, regarding the programmable switches $101_1, \ldots, 101_{n-1}$, and $101_n$; the open state or the closed state is set in advance at the time of factory shipment of the FPGA 1. For example, at the time of factory shipment of the FPGA 1, it is checked whether or not any configuration memories included in the FPGA 1 are defective. Then, the closed state is set regarding the programmable switch corresponding to the FF circuit which outputs a selection signal and a non-selection signal to each configuration memory determined to be defective.

Given below is the explanation of a specific configuration of the memory switching circuit 40. In the configuration illustrated in FIG. 5, the output of the FF circuits $102_1, \ldots, 102_{n-1}$, and $102_n$ is directly sent to the configuration memories $100_1, \ldots, 100_{n-1}$, and $100_n$, respectively. In this configuration, for example, in the case in which the programmable switch $101_1$ is in the closed state, the output of the FF circuit $102_1$ becomes indefinite. Thus, there is a possibility that, due to a leak from the FF circuit $102_1$, the desired signal is not sent to the configuration memory $100_1$. Thus, in the actual configuration of the memory switching circuit 40, a circuit meant for leak prevention is installed.

Figure 9:
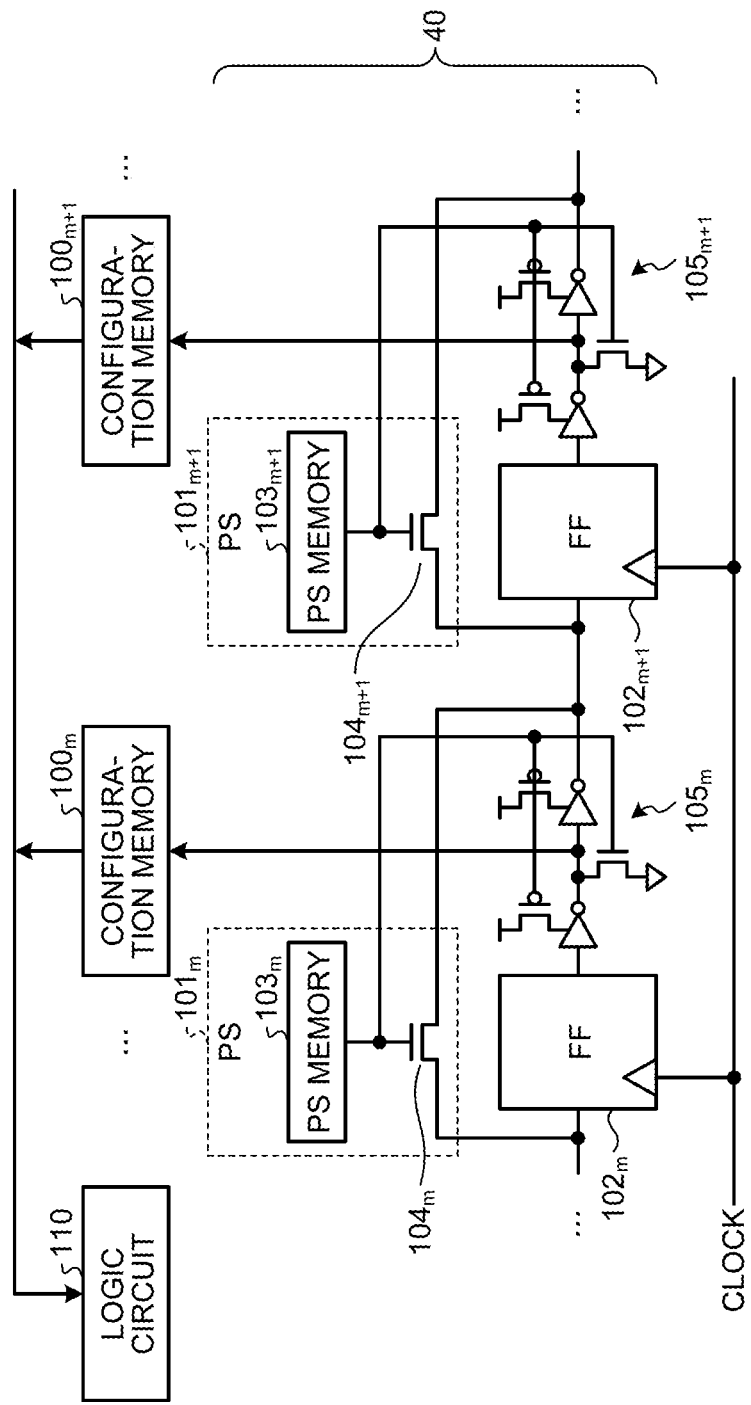
FIG. 9 is a block diagram illustrating an example of a specific configuration of the memory switching circuit according to the first embodiment.

In FIG. 9 is illustrated an example of a specific configuration of the memory switching circuit 40 according to the first embodiment. In FIG. 9, configuration memories $100_m$, $100_{m+1}$, and so on are connected in parallel with respect to the logic circuit 110. In the following explanation, as an example, the selection signal represents a power-supply voltage (VDD), and the non-selection signal represents a grounding voltage. Moreover, when programmable switches $101_m$, $101_{m+1}$, and so on are in the closed state, it is assumed that the corresponding configuration memories $100_m$, $100_{m+1}$, and so on are supplied with the grounding voltage.

Meanwhile, the configuration memory 100 is assumed to be any arbitrary configuration memory from among the configuration memories $100_1$ to $100_n$; and the same subscript notation is applicable to all other identical subscript notations.

With reference to FIG. 9, the PSs $101_m$, $101_{m+1}$, and so on include PS memories $103_m$, $103_{m+1}$, and so on as well as include transistors $104_m$, $104_{m+1}$, and so on functioning as first switching elements. The PS memories $103_m$, $103_{m+1}$, and so on, are nonvolatile memories, and a signal according to the stored state is output therefrom. The ON/OFF state of the transistors $104_m$, $104_{m+1}$, and so on is controlled according to the output of the PS memories $103_m$, $103_{m+1}$, and so on, respectively. Thus, for example, when the PS memory $103_m$ is set to the high state and the transistor $104_m$ is set to the ON state; the programmable switch $101_m$ becomes closed, and the output of a FF circuit $102_m$ with respect to the configuration memory $100_m$ is skipped.

The output of the PS memories $103_m$, $103_{m+1}$, and so on is sent also to FF output control circuits $105_m$, $105_{m+1}$, and so on, respectively. When the PS memories $103_m$, $103_{m+1}$, and so on are set to the high state, the FF output control circuits $105_m$, $105_{m+1}$, and so on supply a constant voltage to the configuration memories $100_m$, $100_{m+1}$, and so on, respectively, as well as prevent a leak from the FF circuits $102_m$, $102_{m+1}$, and so on that are installed at the respective immediately prior stages.

When the PS memory $103_m$ is set to the high state and the transistor $104_m$ is set to the ON state and when the output of the FF circuit installed at the prior stage is input to the FF circuit installed at the subsequent stage, each of the FF output control circuits $105_m$, $105_{m+1}$, and so on prevents a leak of the output of the FF circuit installed at the corresponding prior stage.

Figure 10:
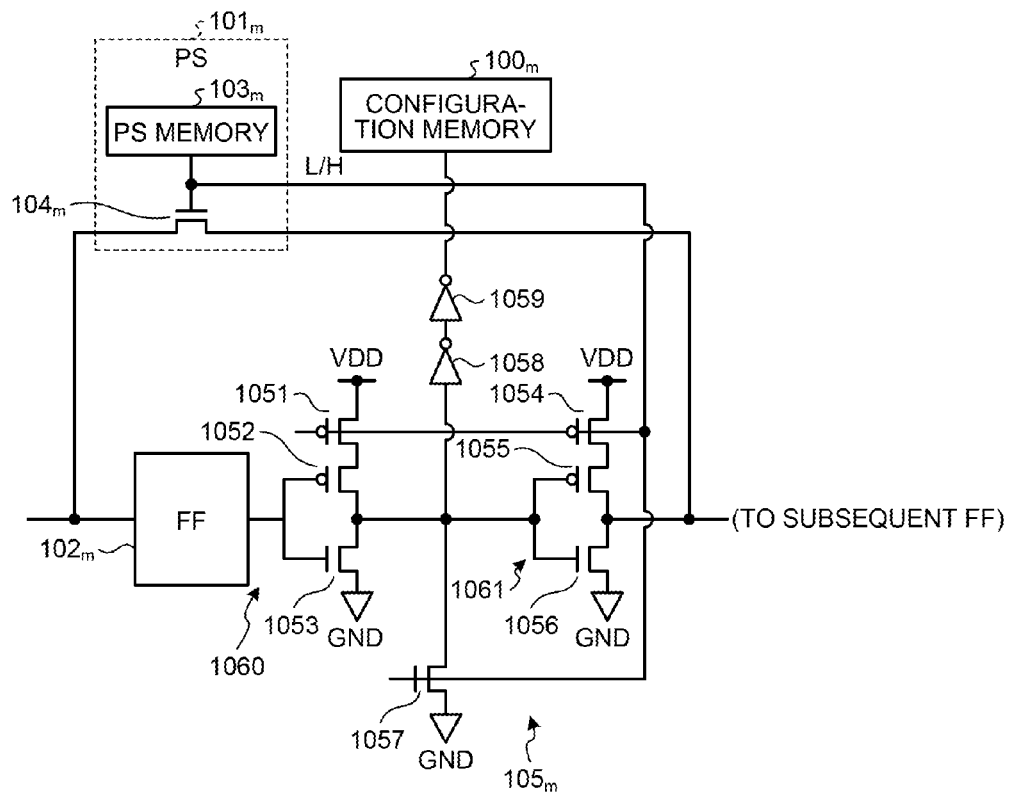
FIG. 10 is a circuit diagram illustrating in more detail an exemplary configuration of an FF output control circuit according to the first embodiment.

In FIG. 10 is illustrated in more detail an exemplary configuration of the FF output control circuit $105_m$ according to the first embodiment. In FIG. 10, the common portion with FIG. 9 is referred to by the same reference numerals, and the detailed explanation is not repeated. The FF output control circuit 105m includes transistors 1051 to 1057 and includes inverter circuits 1058 and 1059. However, the inverter circuits 1058 and 1059 may be omitted.

The transistors 1052 and 1053 constitute an inverter circuit 1060, while the transistors 1054 and 1055 constitute an inverter circuit 1061. The output of the PS memory $103_m$ is sent to a gate and, in the low state of the output of the PS memory $103_m$, the transistor 1051 supplies a power-supply voltage VDD to the inverter circuit 1060. In an identical manner, the output of the PS memory $103_m$ is sent to a gate and, in the low state of the output of the PS memory $103_m$, the transistor 1052 supplies the power-supply voltage VDD to the inverter circuit 1061.

The output of the FF circuit $102_m$, which is disposed at the immediately prior stage of the FF output control circuit $105_m$, is input to the subsequent FF circuit $102_{m+1}$, via the inverter circuits 1060 and 1061. The connection point of the output of the inverter circuit 1060 and the input of the inverter circuit 1061 is connected to the configuration memory $100_m$ via the inverter circuits 1058 and 1059. Moreover, that connection point is also connected to a grounding voltage (GND) via the transistor 1057. In the transistor 1057, the output of the PS memory $103_m$ is supplied to the gate. Moreover, the output of the PS memory $103_m$ is supplied to the gates of the transistors 1051, 1054, and 1057.

In such a configuration, when the PS memory $103_m$ switches to the high state, the transistor 1057 switches to the ON state and the connection point of the transistor 1057 with the inverter circuits 1060 and 1061 becomes the grounding voltage. As a result, the grounding voltage gets input to the configuration memory $100_m$ that is connected to the connection point via the inverter circuits 1058 and 1059. In the configuration memory $100_m$, if the non-selection signal represents the grounding voltage, the output of the configuration memory $100_m$ is closed.

Due to the output of the high state of the PS memory $103_m$; the transistor 1051 is switched to the OFF state, and the power supply to the inverter circuit 1060 is disconnected. As a result, a leak is prevented from occurring from the FF circuit $102_m$.

In an identical manner, due to the output of the high state of the PS memory $103_m$, the transistor 1054 is switched to the OFF state and the power supply to the inverter circuit 1061 is disconnected. Along with that, in the high state of the PS memory $103_m$, the transistor $104_m$ switches to the ON state and the output of the FF circuit (not illustrated), which is installed at the prior stage of the FF circuit $102_m$, is supplied to the FF circuit $102_{m+1}$, which is installed at the subsequent stage of the FF circuit $102_m$, while skipping the FF circuit $102_m$. The power supply to the inverter circuit 1061 is disconnected; and, due to the transistor 1057 in the ON state, the connection point of the transistor 1057 with the inverter circuits 1060 and 1061 becomes the grounding voltage. Hence, the transistor 1056 in the inverter circuit 1061 is also switched to the OFF state. Therefore, the output of the FF circuit installed at the prior stage of the FF circuit $102_m$ is supplied without modification to the FF circuit $102_{m+1}$, which is installed at the subsequent stage of the FF circuit $102_m$.

Given below is the detailed description of an exemplary configuration of the PS memories $103_m$, $103_{m+1}$, and so on according to the first embodiment. In the following explanation, unless otherwise specified, the PS memories $103_m$, $103_{m+1}$, and so on are representatively referred to as the PS memory $103_m$.

Figure 11:
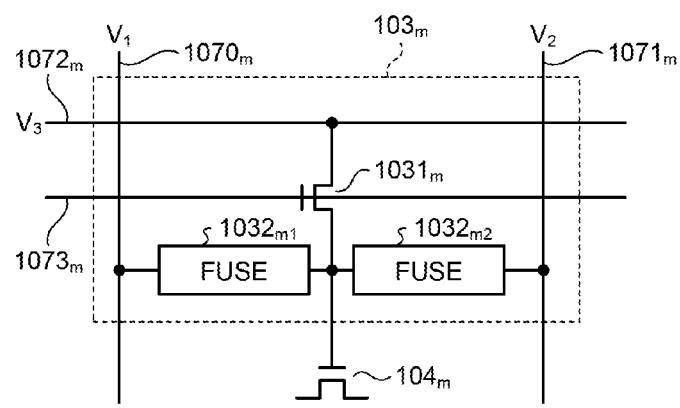
FIG. 11 is a circuit diagram illustrating an exemplary configuration of a PS memory according to the first embodiment.

In FIG. 11 is illustrated an exemplary configuration of the PS memory $103_m$ according to the first embodiment. As described above, at the time of factory shipment of the FPGA 1, depending on the defective/non-defective state of the configuration memories $100_1$ to $100_n$, the setting of the low/high state is done in the PS memory $103_m$. For that reason, the PS memory $103_m$ has a configuration for storing the low/high state in a nonvolatile manner.

With reference to FIG. 11, the PS memory $103_m$ includes, a transistor $1031_m$ functioning as a second switching element; and includes fuses $1032_{m1}$ and $1032_{m2}$ that function as a first writing unit and a second writing unit, respectively. One end of the fuse $1032_{m1}$ is supplied with a power supply $V_1$ from a power wire $1070_m$, while one end of the fuse $1032_{m2}$ is supplied with a power supply $V_2$ from a power wire $1071_m$. The other ends of the fuses $1032_{m1}$ and $1032_{m2}$ are connected to each other.

To the gate of the transistor $1031_m$ is connected a writing selection signal line $1073_m$, which is used in supplying a writing selection signal. Moreover, a power wire $1072_m$, which is used in supplying a power supply $V_3$, is connected to the connection point of the fuses $1032_{m1}$ and $1032_{m2}$ via the transistor $1031_m$. The same connection point is also connected to the gate of the transistor $104_m$. Meanwhile, although not illustrated in FIG. 11, to the same connection point is also connected the gate of the transistor 1057, which is installed in the FF output control circuits $105_m$.

When a voltage equal to or greater than a certain value (called a breakdown voltage) is applied to the fuses $1032_{m1}$ and $1032_{m2}$, disruptive conduction occurs in the fuses $1032_{m1}$ and $1032_{m2}$ thereby resulting in a low-resistance state in which the resistance value is sufficiently low as compared to the resistance value in the non-breakdown state. In the fuses $1032_{m1}$ and $1032_{m2}$, the leak current during the non-breakdown state is small enough to be ignorable, and the difference in resistance between the resistance value after disruptive conduction and the resistance value in the non-breakdown state is assumed to be sufficiently large. The state in which disruptive conduction has occurred in the fuses $1032_{m1}$ and $1032_{m2}$ is called a writing state; and causing disruptive conduction in the fuses $1032_{m1}$ and $1032_{m2}$ by supplying the breakdown voltage is called performing writing. In the fuses $1032_{m1}$ and $1032_{m2}$, the writing state is held in a nonvolatile manner.

If only one of the fuses $1032_{m1}$ and $1032_{m2}$ is switched to the writing state, then the voltage supplied to one end of the fuse in the writing state gets supplied to, for example, the gate of the transistor $104_m$. For example, if the fuse $1032_{m1}$ is switched to the writing state, then the power supply $V_1$ from the power wire $1070_m$ is supplied to the gate of the transistor $104_m$. Similarly, if the fuse $1032_{m2}$ is switched to the writing state, then the power supply from the power wire $1071_m$ is supplied to the gate of the transistor $104_m$. Therefore, for example, if the ON voltage and the OFF voltage of the transistor $104_m$ are set to the voltages of the power supplies $V_1$ and $V_2$, respectively; then the writing state of the fuses $1032_{m1}$ and $1032_{m2}$ enables setting of the open state or the closed state of the transistor $104_m$, and control can be performed about whether or not to skip the output of the FF circuit $102_m$.

Figure 12:
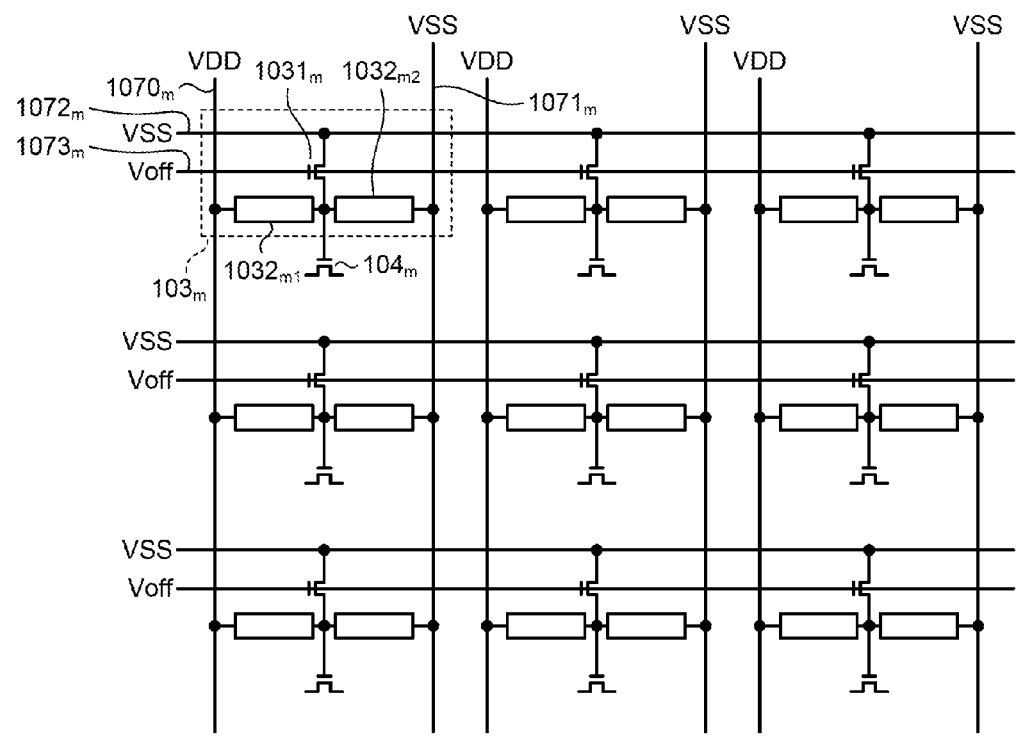
FIG. 12 is a circuit diagram illustrating an example of connections of the PS memories according to the first embodiment.

In FIG. 12 is illustrated an example of connections of the PS memories $103_m$, $103_{m+1}$, and so on. For example, the PS memories $103_m$, $103_{m+1}$, and so on are arranged in a matrix-like manner, and power supplies are connected in units of columns and rows of the matrix. In the example illustrated in FIG. 12, in the matrix, the PS memories $103_m$, $103_{m+1}$, and so on are commonly connected to the power wire $1070_m$ and the power wire $1071_m$ in the column direction and are commonly connected to the power wire $1072_m$ and the writing selection signal line $1073_m$ in the row direction.

In such connections, a grounding voltage VSS is supplied from the power wire $1072_m$; and a voltage Voff that is used in turning OFF the transistor $1031_m$ is supplied to the writing selection signal line $1073_m$ at each row. Moreover, the power-supply voltage VDD is supplied from the power wire $1070_m$, and the grounding voltage VSS is supplied from the power wire $1071_m$. As a result, for example, in the PS memory $103_m$, according to the state of the fuses $1032_{m1}$ and $1032_{m2}$, the transistor $104_m$ is supplied either with the power-supply voltage VDD or the grounding voltage VSS, and the ON/OFF state of the transistor $104_m$ is controlled.

Figure 13:
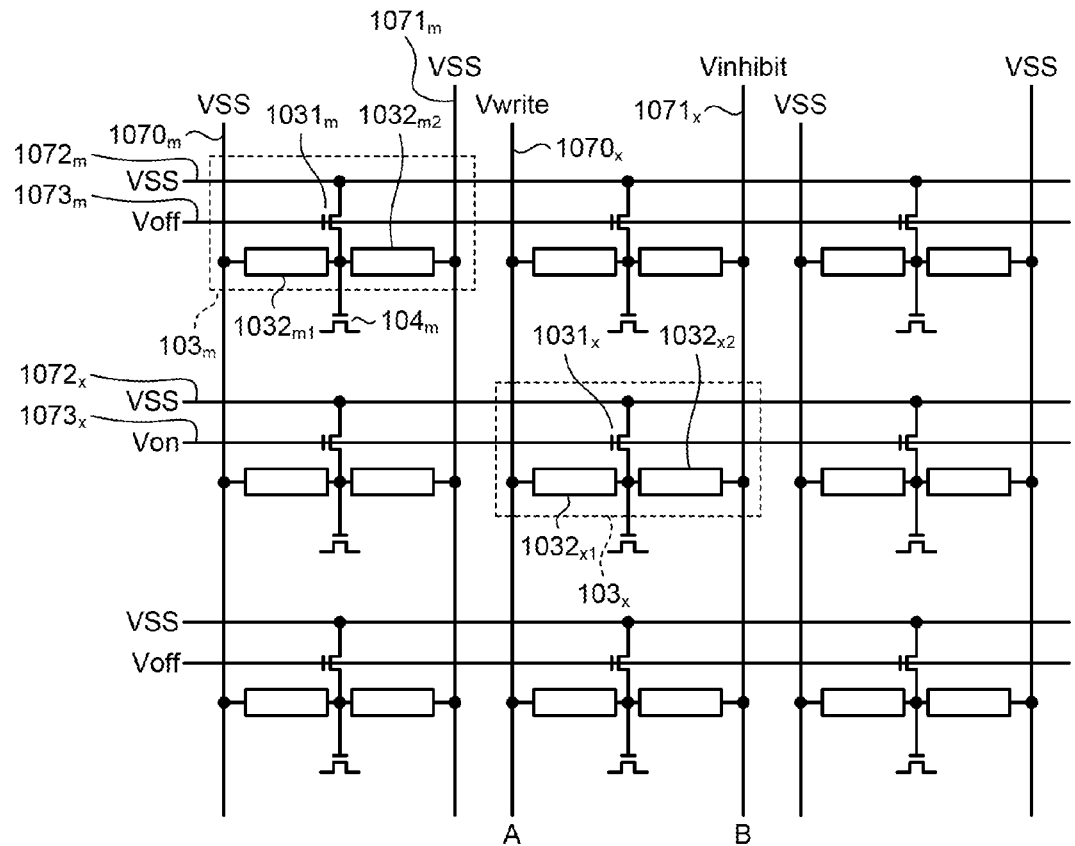
FIG. 13 is a circuit diagram for explaining a writing operation performed with respect to the PS memories according to the first embodiment.

Explained below with reference to FIG. 13 is a writing operation performed with respect to the PS memories $103_m$, $103_{m+1}$, and so on that are connected in the manner illustrated in FIG. 12. Herein, the explanation is given for a case of performing writing in a fuse $1032_{x1}$ in a PS memory $103_x$. In the column in which the PS memory $103_x$ is placed, a power wire $1070_x$ connected to the fuse $1032_{x1}$, which is the target for writing, is supplied with a writing voltage Vwrite; while a power wire $1071_x$ connected to a fuse $1032_{x2}$, which is not the target for writing, is supplied with a non-breakdown voltage Vinhibit. Moreover, a power wire $1072_x$ is supplied with the grounding voltage VSS.

Herein, the writing voltage Vwrite represents a voltage value that is equal to or greater than a breakdown threshold voltage and that leads to disruptive conduction in the fuse $1032_{x1}$. The non-breakdown voltage Vinhibit represents a voltage value not exceeding the breakdown threshold voltage. Meanwhile, regarding the relationship between the writing voltage Vwrite, the breakdown threshold voltage, and the power-supply voltage VDD; it is possible to think of setting the relationship as the writing voltage Vwrite>the breakdown threshold voltage>the power-supply voltage VDD.

In this way, the writing voltage Vwrite and the non-breakdown voltage Vinhibit are supplied to the column in which the fuse $1032_{x1}$, which is the target for writing, is placed. Then, to a writing selection signal line $1073_x$ of the row in which the fuse $1032_{x1}$ is placed, a voltage Von for turning ON a transistor $1031_x$ is supplied. As a result, in the PS memory $103_x$, the potential difference of the writing voltage Vwrite is applied to the fuse $1032_{x1}$ that is the target for writing; and the fuse $1032_{x1}$ is switched to the writing state. On the other hand, in the PS memory $103_x$, the non-breakdown voltage Vinhibit is applied to the fuse $1032_{x2}$ that is not the target for writing, so that writing is not perform with respect to the fuse $1032_{x2}$.

In the matrix illustrated in FIG. 12, in the row in which the voltage Von is not supplied to the writing selection signal line $1073_m$, it is possible to think that a floating state occurs in between the fuses (for example, at the connection point between the fuses $1032_{m1}$ and $1032_{m2}$ illustrated in FIG. 13) and the electrical potential is somewhere between the voltage Vwrite and the voltage Vinhibit. That is, in this case, since a potential difference equal to or greater than the breakdown threshold value is not applied to the fuses $1032_{m1}$ and $1032_{m2}$, there is no disruptive conduction in the fuses $1032_{m1}$ and $1032_{m2}$.

Figure 14:
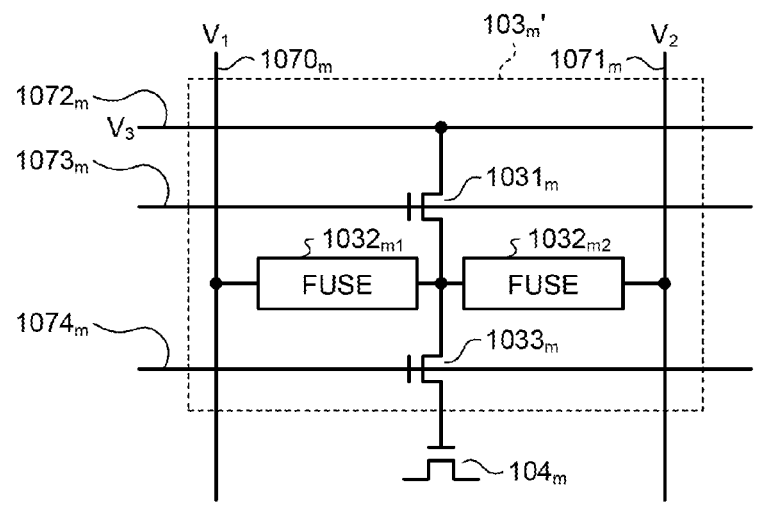
FIG. 14 is a circuit diagram illustrating another exemplary configuration of a PS memory according to the first embodiment.

However, at such an intermediate electrical potential, there is a risk of breakdown of, for example, the transistor $104_m$ connected to the concerned connection point. In that case, as illustrated as a PS memory $103_m'$ in FIG. 14, it is possible to think of inserting a transistor $1033_m$ for disconnection as a third switching element between the concerned connection point and the gate of the transistor $104_m$. To the gate of the transistor $1033_m$ is connected a first disconnection signal line $1074_m$ in common to the row direction of the placement of the PS memory $103_m{}'$ in the matrix. At the timing at which the voltage Von is supplied to the writing selection signal line $1073_m$, a voltage Voff for switching the transistor $1033_m$ to the closed state is supplied to the gate of the transistor $1033_m$ from the first disconnection signal line $1074_m$. As a result, it becomes possible to avoid a situation in which there is breakdown of the transistor $104_m$ during a writing operation.

As far as the fuses $1032_{m1}$ and $1032_{m2}$ are concerned, it is possible to use variable resistance type nonvolatile memories. Examples of the variable resistance type nonvolatile memories that can be used as the fuses $1032_{m1}$ and $1032_{m2}$ include: MTJ (Magnetic Tunnel Junction) elements in which a tunnel barrier layer is sandwiched between two magnetic layers; oxidation-reduction type variable resistance elements in which a transition metal oxide layer is sandwiched between two electrodes, and the movement of deficient oxygen of the transition metal oxide is utilized; ion conduction type variable resistance elements in which, for example, a semiconductor layer is sandwiched between two electrodes, and the movement of ions of a metal inside the semiconductor layer is utilized; and phase change elements that are made of a phase change material and that perform rewriting using Joule heat formed due to an electrical current.

In the FPGA 1 in which such variable resistance type nonvolatile memories are used; it is possible to think of using the variable resistance type nonvolatile memories formed in the FPGA 1 as the fuses $1032_{m1}$ and $1032_{m2}$ by causing disruptive conduction in them. By integrating the memories used in the entire FPGA 1, there is no need to implement unnecessary processes, and it becomes possible to hold down an increase in the area of the FPGA 1.

First Modification Example of First Embodiment

The explanation given earlier is given under the assumption that, during the non-breakdown state of the fuses $1032_{m1}$ and $1032_{m2}$, the leak current is small enough to be ignorable. The following explanation is given for a case in which, during the non-breakdown state of the fuses, the leak is equal to or greater than a predetermined level. In that case, if the PS memories $103_m$, $103_{m+1}$, and so on are configured as a matrix-like array as illustrated in FIG. 12, then a penetration leak current is generated in the fuses other than the target fuse for writing too, thereby leading to a voltage drop at various positions. Hence, there is a possibility that a writing voltage does not get applied to the target fuse for writing.

Moreover, the variable resistance type nonvolatile memories used in the FPGA 1 are likely to have a large leak current in comparison to commonly-used fuses. If the variable resistance type nonvolatile memories having a large leak current are used as the fuses $1032_{m1}$ and $1032_{m2}$, it becomes necessary to have a countermeasure to the leak current.

In a first modification example of the first embodiment, a switching element for disconnection is inserted in between the fuse $1032_{m1}$ and the power supply $V_1$ as well as in between the fuse $1032_{m2}$ and the power supply $V_2$. Because of the switching elements, when the fuses $1032_{m1}$ and $1032_{m2}$ are not the targets for writing, the connection between the fuse $1032_{m1}$ and the power wire $1070_m$ and the connection between the fuse $1032_{m2}$ and the power wire $1071_m$ are terminated.

Figure 15:
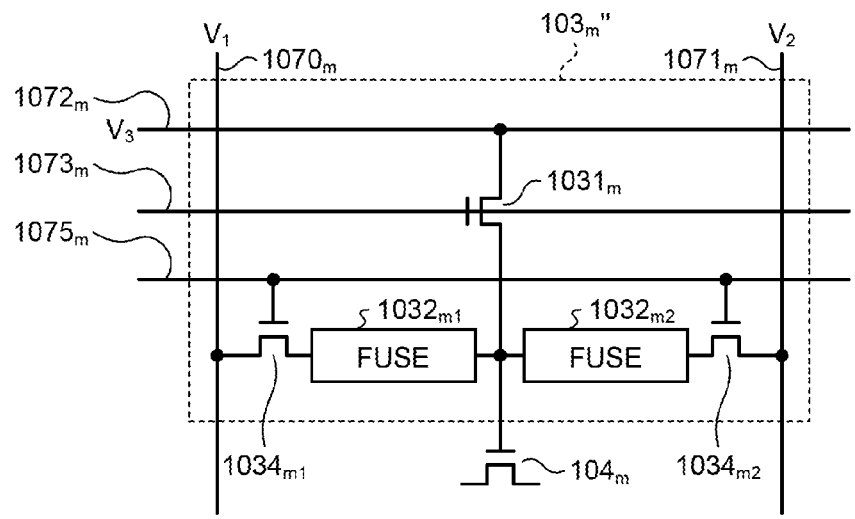
FIG. 15 is a circuit diagram illustrating an exemplary configuration of a PS memory according to a first modification example of the first embodiment.

In FIG. 15 is illustrated an exemplary configuration of a PS memory $103_m{}''$ according to the first modification example of the first embodiment, in FIG. 15, the common portion with FIG. 11 is referred to by the same reference numerals, and the detailed explanation is not repeated.

In between the fuse $1032_{m1}$ and the power supply $V_1$, a transistor $1034_{m1}$ for disconnection is inserted as a fourth switching element or a fifth switching element. Similarly, in between the fuse $1032_{m2}$ and the power supply $V_2$, a transistor $1034_{m2}$ for disconnection is inserted as a fourth switching element or a fifth switching element. To the gates of the transistors $1034_{m1}$ and $1034_{m2}$ is connected a second disconnection signal line $1075_m$ in common to the column direction of the placement of the PS memory $103_m{}''$ in the matrix.

Figure 16:
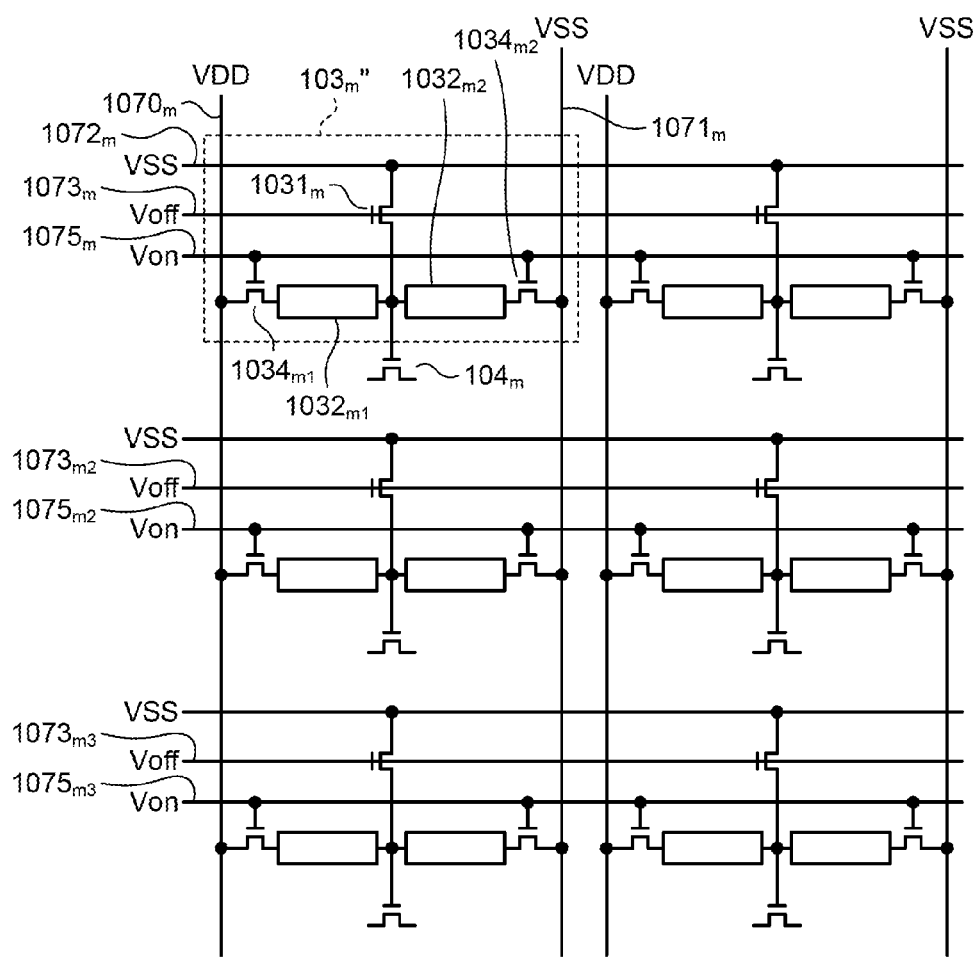
FIG. 16 is a circuit diagram illustrating an example of voltages during the operations performed by the PS memory according to the first modification example of the first embodiment.

In FIG. 16 is illustrated an example of the voltages during the operations performed by the PS memory $103_m{}''$. During the operations performed by the PS memory $103_m{}''$, as illustrated in FIG. 16, each of writing selection signal lines $1073_m$, $1073_{m2}$, and $1073_{m3}$ at each row supplies the voltage Voff; while each of second disconnection signal lines $1075_m$, $1075_{m2}$, and $1075_{m3}$ supplies the voltage Von for switching the connected transistors to the ON state. In the example of the PS memory $103_m{}''$, due to the voltage Von supplied by the second disconnection signal line $1075_m$, the transistors $1034_{m1}$ and $1034_{m1}$ are switched to the ON state. Therefore, continuity is achieved between the fuse $1032_{m1}$ and the power wire $1070_m$ of the voltage VDD as, well as between the fuse $1032_{m2}$ and the power wire $1071_m$ of the voltage VSS.

Figure 17:
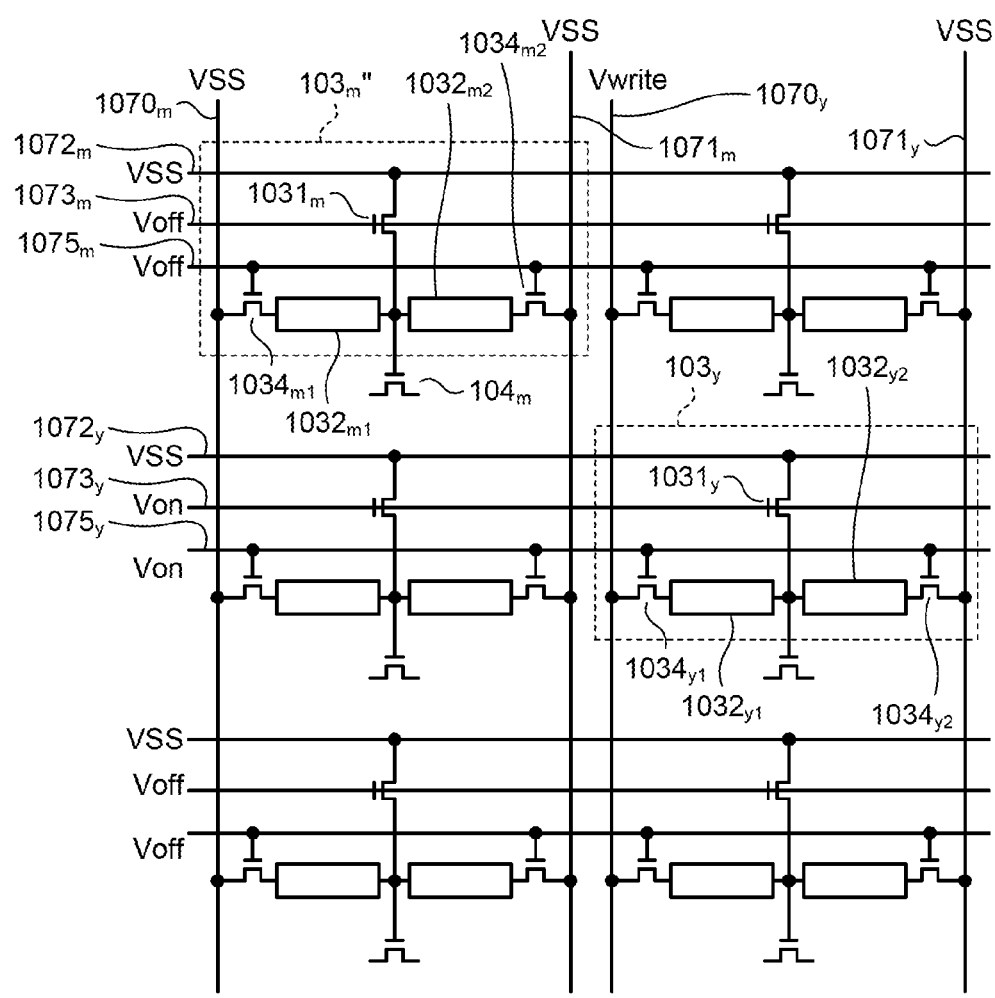
FIG. 17 is a circuit diagram illustrating an example of voltages at the time of writing performed with respect to the PS memory according to the first modification example of the first embodiment.

In FIG. 17 is illustrated an example of the voltages at the time of writing performed with respect to the PS memory $103_m{}''$ according to the first modification example of the first embodiment. In FIG. 17 is illustrated an example in which, in a PS memory $103_y$, writing is performed with respect to a fuse $1032_{y1}$ from among fuses $1032_{y1}$ and $1032_{y2}$.

As described above, at the time of performing writing with respect to the fuse $1032_{y1}$, the writing voltage Vwrite is supplied to the power wire $1070_y$, that is connected to the fuse $1032_{y1}$ which is the target for writing in the PS memory $103_y$. Moreover, in the example illustrated in FIG. 17, to the fuse $1032_{y2}$ that is not the target for writing in the PS memory $103_y$, the voltage VSS is supplied, and not the voltage Vinhibit, from a power wire $1071_y$. Furthermore, to a writing selection signal line $1073_y$ of the row in which the fuse $1032_{y1}$ is placed, the voltage Von is supplied for switching a transistor $1031_y$ to the ON state. However, to the writing selection signal line $1073_m$ of the row in which no target fuse for writing is present, the voltage Voff is supplied.

In the first modification example of the first embodiment, additionally, to a second disconnection signal line $1075_y$ connected with the fuse $1032_{y1}$ that is the target for writing, the voltage Von is supplied for switching transistors $1034_{y1}$ and $1034_{y2}$ to the ON state. Moreover, to the second disconnection signal line $1075_m$ of the row to which the target fuse for writing is not connected, the voltage Voff is supplied for switching the connected transistors to the OFF state. As a result, the writing voltage Vwrite is prevented from leaking, and a predetermined writing voltage is supplied to the fuse $1032_{y1}$ that is the target for writing.

Figure 18:
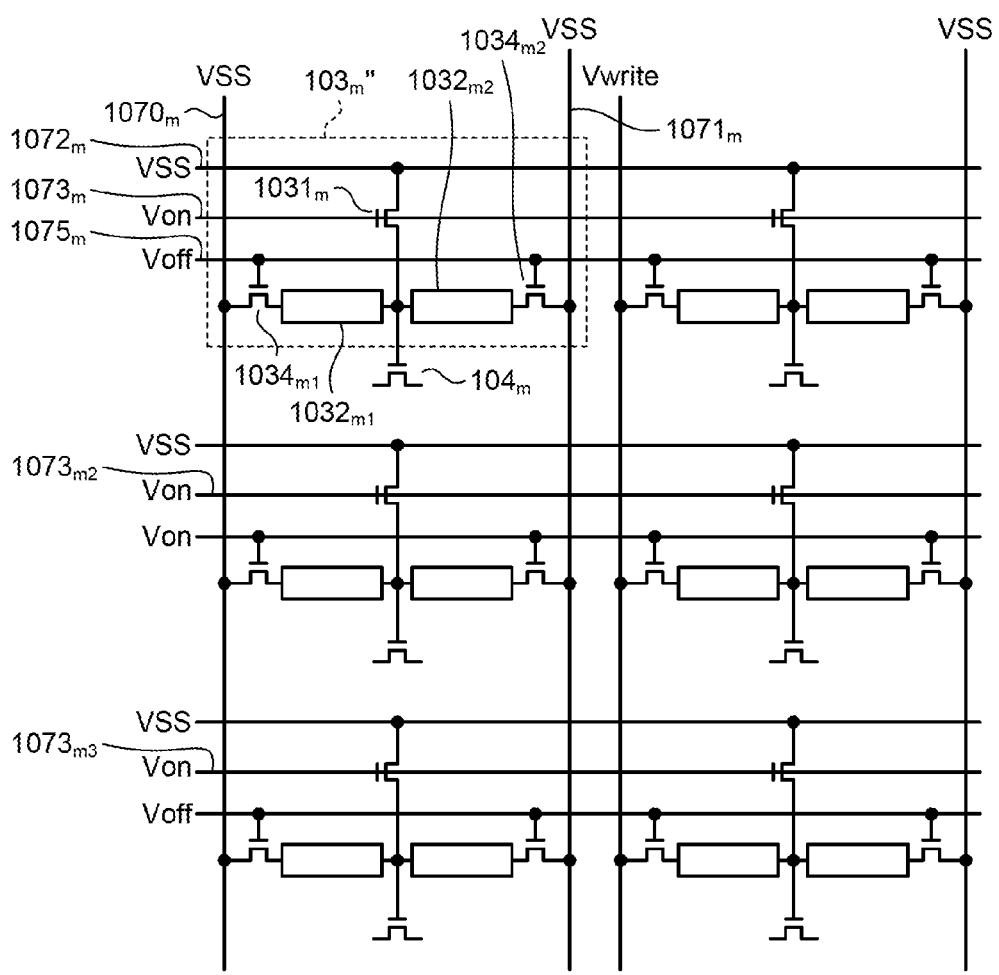
FIG. 18 is a circuit diagram illustrating another example of voltages at the time of writing performed with respect to the PS memory according to the first modification example of the first embodiment.

Meanwhile, in the configuration illustrated in FIG. 17, a floating state occurs in between the fuses that are not the targets for writing (for example, at the connection point between the fuses $1032_{m1}$ and $1032_{m2}$). For that reason, as illustrated in FIG. 18, the voltage Von may be supplied to all writing selection signal lines $1073_m$, $1073_{m2}$, and $1073_{m3}$;

while the connection points between the fuses that are not the targets for writing may be set to the voltage VSS.

Second Modification Example of First Embodiment

Given below is the explanation of a second modification example of the first embodiment. In the case of configuring programmable switches using variable resistance type non-volatile memories as the fuses as described earlier, there is a possibility that the memories used as fuses also have memory defects such as conduction or disconnection from the time of manufacturing the memories. For example, with reference to the example illustrated in FIG. 11, consider a case in which the fuse $1032_{m1}$, which is connected to the power wire $1070_m$ supplying the power-supply voltage VDD, has a conduction-related defect of being in a conduction state from the time of manufacturing. In that case, since the fuse $1032_{m1}$ remains in a conduction state without performing a writing operation, it is highly likely to not pose any problem.

In contrast, consider a case in which the fuse $1032_{m2}$, which is connected to the power wire $1071_m$ supplying the grounding voltage VSS, has a conduction-related defect. In that case, it is highly likely that the PS memory $103_m$ cannot obtain the desired output. Moreover, in the case of a disconnection-related defect in which the fuses $1032_{m1}$ and $1032_{m2}$ do not switch to a conduction state even after performing a writing operation, it is highly likely that the PS memory $103_m$ cannot obtain the desired output.

In that regard, in the second modification example of the first embodiment, all configuration memories included in a multi-configuration memory are disabled so as to deal with the defects in the fuses included in the programmable switches.

Figure 19:
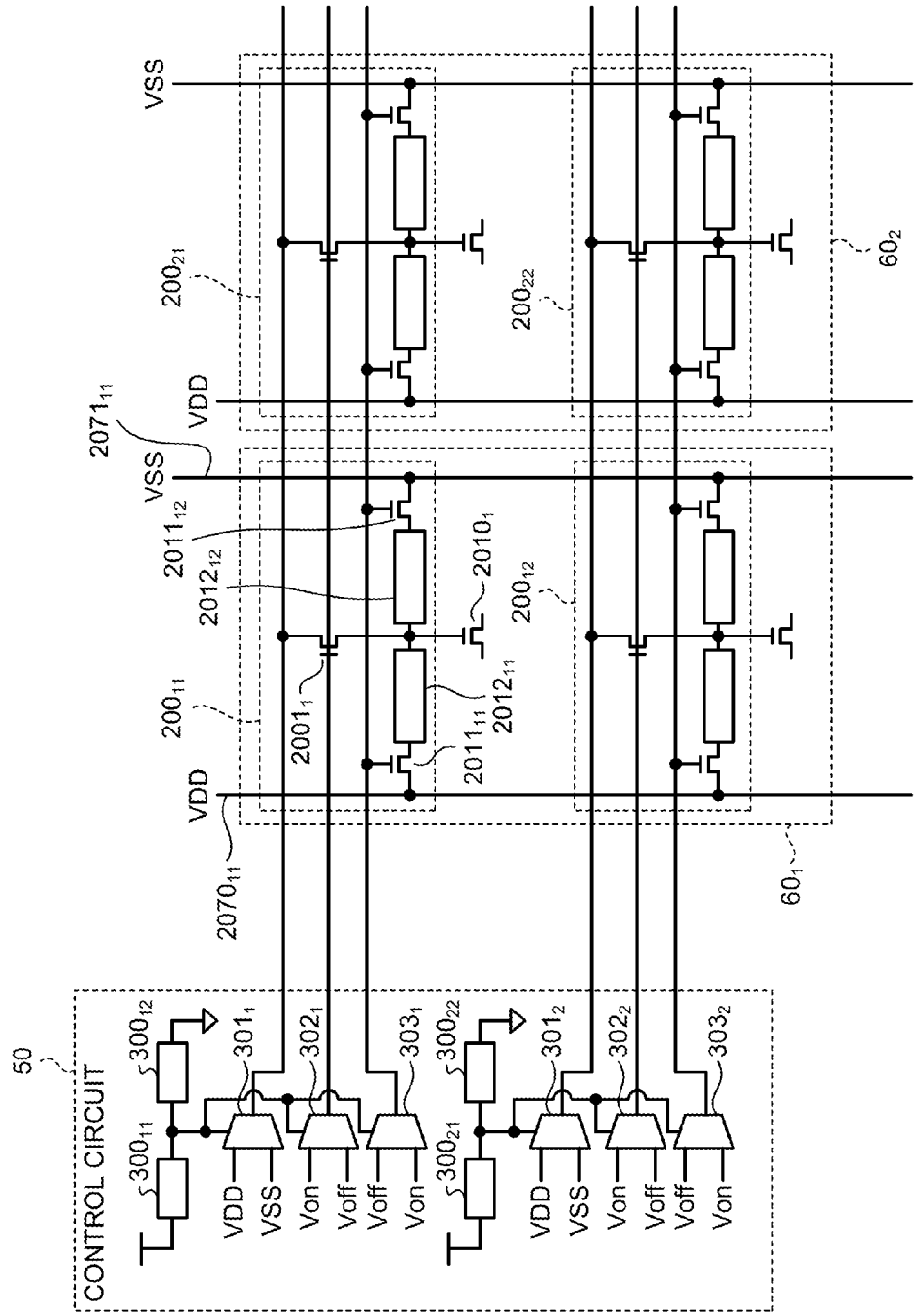
FIG. 19 is a block diagram illustrating an example of connections in an LB/SB block according to a second modification example of the first embodiment.

In FIG. 19 is illustrated an example of connections in an LB/SB block according to the second modification example of the first embodiment. With reference to FIG. 19, a block $60_1$ includes a plurality of configuration memories $200_{11}$, $200_{12}$, and so on to which is connected the output of a single FF circuit from among the FF circuits constituting a shift register circuit that is included in the memory switching circuit 40. Similarly, a block $60_2$ includes a plurality of configuration memories $200_{21}$, $200_{22}$, and so on to each of which is connected the output of a FF circuit that, from among the FF circuits constituting a shift register circuit included in the memory switching circuit 40, is installed at the subsequent stage to the FF circuit having the output thereof connected to the block $60_1$.

Figure 20:
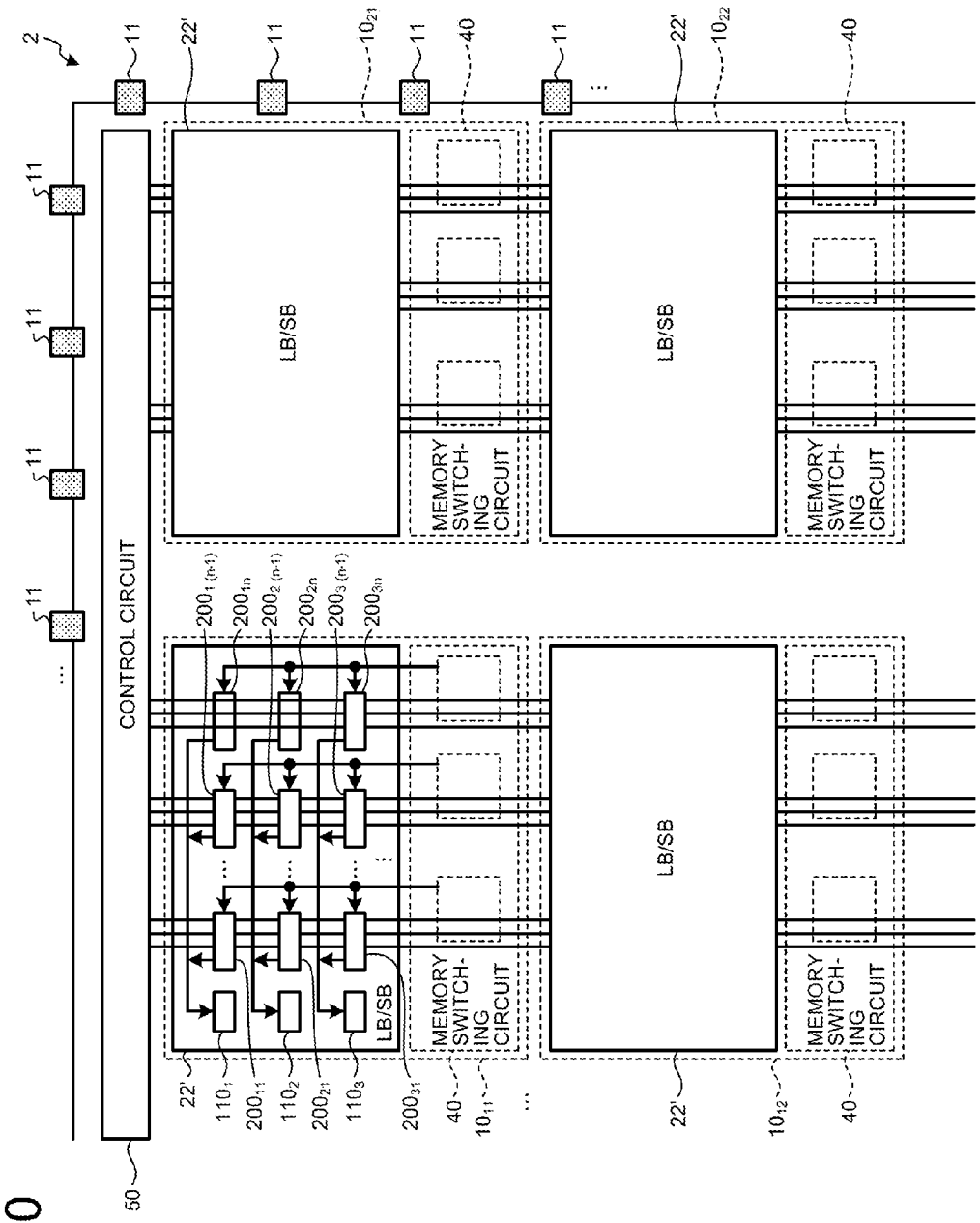
FIG. 20 is a block diagram illustrating an exemplary configuration of an entire FPGA, which includes a control circuit, according to the second modification example of the first embodiment.

A control circuit 50 controls enabling/disabling of the configuration memories $200_{11}$, $200_{21}$, and so on as well as the configuration memories $200_{12}$, $200_{22}$, and so on that are serially connected across LB/SB blocks $22_1'$, $22_2'$, and so on (see FIG. 20).

For example, the configuration memory $200_{11}$ has a configuration corresponding to the PS memory $103_m''$ explained with reference to FIG. 15. Regarding the configuration memories $200_{11}$, $200_{12}$, . . . , $200_{21}$, $200_{22}$, and so on; the explanation is given with reference to the configuration memory $200_{11}$.

With reference to FIG. 19, the control circuit 50 includes a plurality of circuits each of which includes two fuses and includes three selectors that are controlled for selection by the two fuses. In the example illustrated in FIG. 19, the control circuit 50 includes a first circuit including fuses $300_{11}$ and $300_{12}$ and including selectors $301_1$, $302_1$, and $303_1$; and includes a second circuit including fuses $300_{21}$ and $300_{22}$ and including selectors $301_2$, $302_2$, and $303_2$.

The explanation about the control circuit 50 is given with reference to the first circuit. The fuses $300_{11}$ and $300_{12}$ represent fuses in the FPGA 1 that are separately manufactured once every certain number of fuses and that have a high degree of reliability. In the selector $301_1$, one selection input terminal has the power-supply voltage VDD connected thereto and the other selection input terminal has the grounding voltage VSS connected thereto. In the selector $301_2$, one selection input terminal has the voltage Von, which sets a transistor to the closed state, connected thereto and the other selection input terminal has the voltage Voff, which sets a transistor to the open state, connected thereto. In the selector $303_1$, one selection input terminal has the voltage Voff connected thereto and the other selection input terminal has the voltage Von connected thereto.

Regarding each of the selectors $301_1$, $302_1$, and $303_1$; one selection input terminal and the other selection input terminal are selected in common by the fuses $300_{11}$ and $300_{12}$, one of which is in the writing state and the other is in the non-breakdown state. Depending on the output of each of the selectors $301_1$, $302_1$, and $303_1$ according to the selection result, enabling/disabling setting for all configuration memories $200_{11}$, $200_{21}$, and so on, which are serially connected across the LB/SB blocks $22_1'$, $22_2'$, and so on, is done in the selectors $301_1$, $302_1$, and $303_1$.

The configuration memory $200_{11}$ has a configuration corresponding to the PS memory $103_m''$ explained with reference to FIG. 15. That is, one end of a fuse $2012_{11}$ is connected to a power wire $2070_{11}$, which supplies the power-supply voltage VDD, via a transistor $2011_{11}$. Similarly, one end of a fuse $2012_{12}$ is connected to a power wire $2071_{11}$, which represents the grounding voltage VSS, via a transistor $2011_{12}$. The gates of the transistors $2011_{11}$ and $2011_{12}$ are connected to the output of the selector $302_1$. The connection point of the fuses $2012_{11}$ and $2012_{12}$ serves as the output of the configuration memory $200_{11}$. Moreover, that connection point is connected to the output of the selector $301_1$ via a transistor $2001_1$. The gate of the transistor $2001_1$ is connected to the output of the selector $302_1$.

The output of the configuration memory $200_{11}$ is connected to the gate of a transistor $2010_1$ constituting a logic circuit.

In such a configuration, for example, in the case of enabling the serially-connected configuration memories $200_{11}$, $200_{21}$, and so on; the voltage VSS is selected at the selector $301_1$, the voltage Voff is selected at the selector $302_1$, and the voltage Von is selected at the selector $303_1$. As a result, for example, in the configuration memory $200_{11}$, the transistors $2011_{11}$ and $2011_{12}$ are set to the closed state; one end of the fuse $2012_{11}$ gets connected to the power wire $2070_{11}$ and is supplied with the power-supply voltage VDD; and one end of the fuse $2012_{12}$ gets connected to the power wire $2071_{11}$ and is supplied with the grounding voltage VSS. Moreover, the transistor $2001_1$ is set to the open state; and the connection point of the fuses $2012_{11}$ and $2012_{12}$, that is, the electrical potential of the output of the configuration memory $200_{11}$ becomes equal to either the power-supply voltage VDD or the grounding voltage VSS depending on the states of the fuses $2012_{11}$ and $2012_{12}$.

On the other hand, in the case of disabling the serially-connected configuration memories $200_{11}$, $200_{21}$, and so on; the voltage VDD is selected at the selector $301_1$, the voltage Von is selected at the selector $302_1$, and the voltage Voff is selected at the selector $303_1$. As a result, for example, in the configuration memory $200_{11}$, the transistors $2011_{11}$ and $2011_{12}$ are set to the open state; and one end of the fuse $2012_{11}$ and one end of the fuse $2012_{12}$ respectively get disconnected from the power-supply voltage VDD and the grounding voltage VSS. Moreover, the transistor $2001_1$ is set to the closed state; and the connection point of the fuses $2012_{11}$ and $2012_{12}$, that is, the output of the configuration memory $200_{11}$ is fixedly set to the power-supply voltage VDD.

In the serially-connected configuration memories $200_{11}$, $200_{21}$, and so on; all outputs are fixedly set to the power-supply voltage VDD. As a result, the configuration memories $200_{11}$, $200_{21}$, and so on are skipped and disabled.

In FIG. 20 is illustrated an exemplary configuration of an entire FPGA 2, which includes the control circuit 50, according to the second modification example of the first embodiment. Each LB/SB block 22' has a configuration in which, for example, the output of the selectors $301_1$, $302_1$, $303_1$, and so on, which are included in the control circuit 50, is connected in the manner illustrated in FIG. 19 to the configuration memories included in the LB/SB block 22 illustrated in FIG. 6. In this way, the output of the selectors $301_1$, $302_1$, $303_1$, and so on, which are included in the control circuit 50, is connected to configuration memories $200_{11}$, $200_{21}$, $200_{31}$, and so on; configuration memories $200_{1(n-1)}$, $200_{2(n-1)}$, $200_{3(n-1)}$, and so on; and configuration memories $200_{1n}$, $200_{2n}$, $200_{3n}$, and so on which, with respect to basic tiles $10_{11}$, $10_{12}$, . . . , $10_{21}$, and $10_{22}$ arranged in a matrix-like manner in the FPGA 2, are arranged in the direction of intersection with the arrangement of the FF circuits included in the memory switching circuits 40.

Consider a case in which the control circuit 50 according to the second modification example of the first embodiment is not disposed. In that case, if a programmable switch, which is used in skipping an FF circuit constituting a shift register circuit for switching between configuration memories, has a conduction-related defect or a disconnection-related defect as described earlier; then, even if a writing operation is performed with respect to the programmable switch, the defect in the configuration memories may not be taken care of. In that case, the FPGA chip needs to be destroyed, thereby making it difficult to enhance the percent defective of the chip against the percent defective of the configuration memories.

In comparison, when the control circuit 50 according to the second modification example of the first embodiment is disposed, only the row including a defective programmable switch is disabled, thereby eliminating the need for destroying the FPGA chip. For that reason, as compared to a configuration in which the control circuit 50 is not disposed, it becomes possible to enhance the percent defective of the chip against the percent defective of the configuration memories.

Second Embodiment

Figure 21:
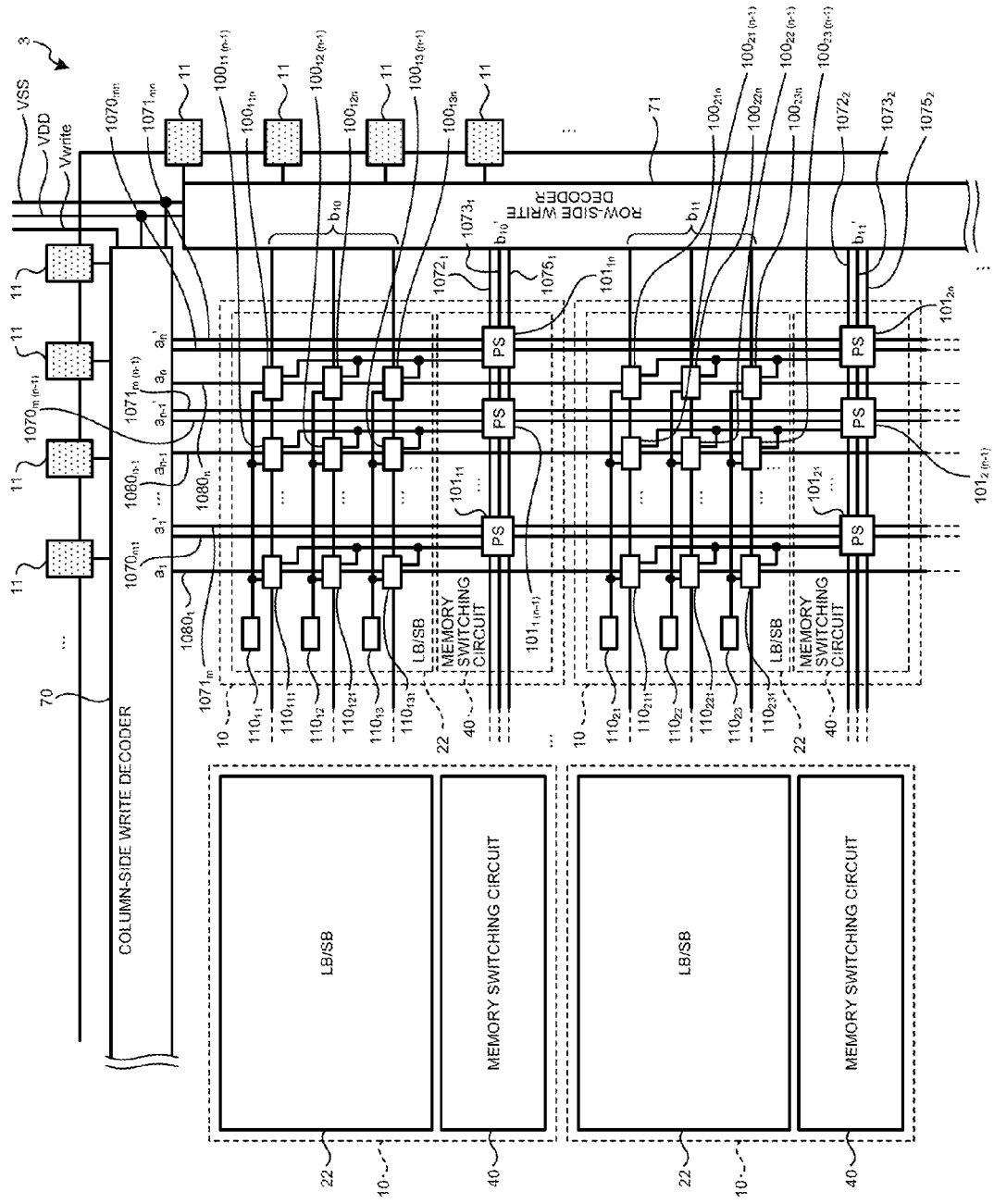
FIG. 21 is a block diagram illustrating an exemplary configuration of an FPGA that includes a write decoder according to a second embodiment.

The FPGA 1 described above may also include a write decoder that performs a writing operation with respect to the programmable switches $101_1$, . . . , $101_{n-1}$, and $101_n$. In FIG. 21 is illustrated an exemplary configuration of an FPGA 3 that includes a write decoder. In FIG. 21, the common portion with FIG. 7 is referred to by the same reference numerals, and the detailed explanation is not repeated.

In the FPGA 3 illustrated in FIG. 21, it is assumed that the PS memory $103_m''$ according to the first modification example of the first embodiment is used as the PS memory (in FIG. 21, written as PS) included in each of the programmable switches $101_1$, . . . , $101_{n-1}$, and $101_n$. Of course, the PS memory $103_m$ or the PS memory $103_m'$ according to the first embodiment can also be used in the FPGA 2.

In FIG. 21, the vertical direction is treated as the column direction, and the horizontal direction is treated as the row direction. Herein, each configuration memory 100 and each PS (programmable switch) 101 are arranged in a line in the column direction for each of the FF circuits $102_1$, . . . , $102_{n-1}$, and $102_n$ (not illustrated) of the memory switching circuit 40. Moreover, each configuration memory 100 is arranged in a line in the row direction for each of logic circuits $110_{11}$, $110_{12}$, . . . , $110_{21}$, $110_{22}$, and so on. Similarly, each PS 101 is arranged in a line in the row direction for each memory switching circuit 40.

As compared to the FPGA 1 illustrated in FIG. 7, the FPGA 3 illustrated in FIG. 21 additionally includes a column-side write decoder 70 and a row-side write decoder 71. The column-side write decoder 70 and the row-side write decoder 71 are capable of communicating with an external device via the I/Os 11, and are respectively supplied with the power-supply voltage VDD and the grounding voltage VSS. Moreover, the column-side write decoder 70 is also supplied with the voltage Vwrite. For example, in response to an instruction received from outside, the column-side write decoder 70 and the row-side write decoder 71 perform writing with respect to the selected programmable switch and fixedly set that programmable switch to at least the closed state from among the closed state and the open state.

Meanwhile, in the FPGA 3 illustrated in FIG. 21, the voltage Vwrite can be supplied alternatively to the row-side write decoder 71. That is, the FPGA 3 can alternatively be configured in such a way that the functions of the column-side write decoder 70 and the functions of the row-side write decoder 71 are interchanged.

In the column-side write decoder 70, column addresses $a_1$, . . . , $a_{n-1}$, and $a_n$ have signal lines $1080_1$, . . . , $1080_{n-1}$, and $1080_n$ connected thereto, respectively. The column addresses $a_1$, . . . , $a_{n-1}$, and $a_n$ are used in selecting the configuration memories 100 on a column-by-column basis.

That is, in the example illustrated in FIG. 21, according to the column address $a_1$, the signal line $1080_1$ selects configuration memories $100_{111}$, $100_{121}$, and $100_{131}$ as well as selects configuration memories $100_{211}$, $100_{221}$, and $100_{231}$ aligned in the column direction. In an identical manner, according to the column address $a_{n-1}$, the signal line $1080_{n-1}$ selects configuration memories $100_{11(n-1)}$, $100_{12(n-1)}$, and $100_{13(n-1)}$ as well as selects configuration memories $100_{21(n-1)}$, $100_{22(n-1)}$, and $100_{23(n-1)}$ aligned in the column direction. Moreover, according to the column address $a_n$, the signal line $1080_{n-1}$ selects configuration memories $100_{11n}$, $100_{12n}$, and $100_{13n}$ as well as selects configuration memories $100_{21n}$, $100_{22n}$, and $100_{23n}$ aligned in the column direction.

Moreover, in the column-side write decoder 70, column addresses $a_1'$, . . . , $a_{n-1}'$, and $a_n'$, which respectively correspond to the column addresses $a_1$, . . . , $a_{n-1}$, and $a_n$, are respectively connected with a set of power wires $1070_{m1}$ and $1071_{m1}$, . . . , a set of power wires $1070_{m(n-1)}$ and $1071_{m(n-1)}$, and a set of power wires $1070_{mn}$ and $1071_{mn}$. Each of the set of power wires $1070_{m1}$ and $1071_{m1}$, . . . , the set of power wires $1070_{m(n-1)}$ and $1071_{m(n-1)}$, and the set of power wires $1070_{mn}$ and $1071_{mn}$ is connected to the PSs 101 aligned in the column direction.

That is, in the example illustrated in FIG. 21, the set of power wires $1070_{m1}$ and $1071_{m1}$ is connected to PSs $101_{11}$, $101_{21}$, and so on that are aligned in the column direction. Similarly, the set of power wires $1070_{m(n-1)}$ and $1071_{m(n-1)}$ is connected to the PSs $101_{1(n-1)}$, $101_{2(n-1)}$, and so on that are aligned in the column direction. Moreover, the set of power wires $1070_{mn}$ and $1071_{mn}$ is connected to the PSs $101_{1n}$, $101_{2n}$, and so on that are aligned in the column direction.

The row-side write decoder 71 selects the configuration memories 100 on a row-by-row basis. At that time, the row-side write decoder 71 can select the configuration memories 100 in units of groups of the configuration memories 100 connected to the same PS 101.

In the example illustrated in FIG. 21, according to an address $b_{10}$, the row-side write decoder 71 commonly selects the configuration memories $100_{111}$, $100_{121}$, and $100_{131}$ connected to the PS $101_{11}$; the configuration memories $100_{11(n-1)}$, $100_{12(n-1)}$, and $100_{13(n-1)}$ connected to the PS $101_{1(n-1)}$; and the configuration memories $100_{11n}$, $100_{12n}$, and $100_{13n}$ connected to the PS $101_{1n}$. In an identical manner, according to an address $b_{11}$, the row-side write decoder 71 commonly selects the configuration memories $100_{211}$, $100_{221}$, and $100_{231}$ connected to the PS $101_{21}$; the configuration memories $100_{21(n-1)}$, $100_{22(n-1)}$, and $100_{23(n-1)}$ connected to the PS $101_{2(n-1)}$; and the configuration memories $100_{21n}$, $100_{22n}$, and $100_{23n}$ connected to the PS $101_{2n}$.

Moreover, in the row-side write decoder 71, row addresses $b_{10}'$, $b_{11}'$, and so on, which correspond to the row addresses $b_{10}$, $b_{11}$, and so on, are respectively connected with a set of a power wire $1072_1$, a writing selection signal line $1073_1$, and a second disconnection signal line $1075_1$; a set of a power wire $1072_2$, a writing selection signal line $1073_2$, and a second disconnection signal line $1075_2$; and so on. Each of the set of the power wire $1072_1$, the writing selection signal line $1073_1$, and the second disconnection signal line $1075_1$; the set of the power wire $1072_2$, the writing selection signal line $1073_2$, and the second disconnection signal line $1075_2$; and so on is connected to the PSs 101 aligned in the row direction.

Thus, in the example illustrated in FIG. 21, the set of the power wire $1072_1$, the writing selection signal line $1073_1$, and the second disconnection signal line $1075_1$ is connected to the PSs $101_{11}, \ldots, 101_{1(n-1)}$, and $101_{1n}$ aligned in the row direction. In an identical manner, the set of the power wire $1072_2$, the writing selection signal line $1073_2$, and the second disconnection signal line $1075_2$ is connected to the PSs $101_{21}, \ldots, 101_{2(n-1)}$, and $101_{2n}$ aligned in the row direction.

In such a configuration, according to an instruction input from each I/O 11, the FPGA 3 can perform a writing operation with respect to the PS 101 that is specified from among PSs $101_{11}, 101_{12}, \ldots, 101_{21}$ and $101_{22}$.

Figure 22:
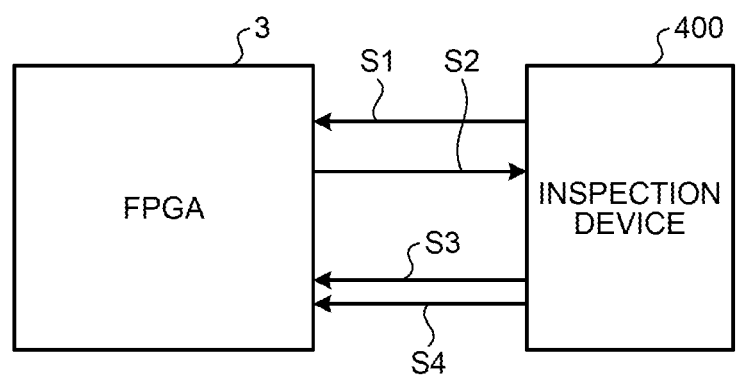
FIG. 22 is a diagram for explaining an example of the writing operation performed by the FPGA according to the second embodiment with respect to a PS.

Explained below with reference to FIG. 22 is an example of the writing operation performed by the FPGA 3 with respect to the PS 101. An inspection device 400 makes use of, for example, a probe making contact with each terminal of the FPGA 3, and performs communication with the FPGA 3 via the I/Os 11. At Step S1, the inspection device 400 performs inspection of each configuration memory 100 in the FPGA 3. The inspection result is returned to the inspection device 400 along with address information of each configuration memory 100 (Step S2).

According to the inspection result about each configuration memory 100 as obtained at Step S2, the inspection device 400 sets the closed state for the PS 101 connected to the configuration memory 100 determined to be defective, and performs writing with respect to that PS 101. In the following explanation, for the purpose of illustration, it is assumed that the configuration memory $100_{121}$ is defective and the address information returned from the FPGA 3 to the inspection device 400 contains the addresses $a_1$ and $b_{10}$.

Meanwhile, in the example illustrated in FIG. 21, for example, the configuration memories $100_{111}$, $100_{121}$, and so on that are commonly connected to the PS $101_{11}$ are commonly assigned with the row address $b_{10}$. For that reason, in reality, the inspection device 400 cannot determine which of the configuration memories $100_{111}$, $100_{121}$, and $100_{131}$ is defective. However, that is not the only possible case. Alternatively, for example, an address can be assigned to each row including the configuration memories $100_{111}$, $100_{121}$, and $100_{131}$; and it can be made possible to determine which of the configuration memories $100_{111}$, $100_{121}$, and $100_{131}$ is defective.

Subsequently, with respect to the FPGA 3, the inspection device 400 performs writing so as to set the PS $101_{11}$, which is connected to the configuration memory $101_{121}$ determined to be defective, to the open state. For example, the inspection device 400 specifies the addresses $a_1'$ and $b_{10}'$, which respectively correspond to the addresses $a_1$ and $b_{10}$ of the configuration memory $101_{121}$, to the column-side write decoder 70 and the row-side write decoder 71, respectively, of the FPGA 3 (Step S3). Then, the inspection device 400 outputs a writing instruction to the FPGA 3 (Step S4).

In response to the writing instruction sent by the inspection device 400 at Step S4, the FPGA 3 performs a writing operation with respect to the PS memories corresponding to the addresses specified at Step S3.

More particularly, in the FPGA 3, regarding the power wires $1070_{m1}$ and $1071_{m1}$ selected at the address $a_1'$, which corresponds to the address $a_1$ and which is specified from the inspection device 400; the column-side write decoder 70 applies the voltage VSS to the power wire $1070_{m1}$ and applies the voltage Vwrite to the power wire $1071_{m1}$. Moreover, regarding the power wire $1072_1$, the writing selection signal line $1073_1$, and the second disconnection signal line $1075_1$ that are selected at the address $b_{10}'$, which corresponds to the address $b_{10}$ and which is specified by the inspection device 400; the row-side write decoder 71 applies the voltage VSS to the power wire $1072_1$, and applies the voltage Von to the writing selection signal line $1073_1$ and the second disconnection signal line $1075_1$.

In this way, when the PS $101_{11}$ is applied with various voltages; the fuse $1032_{m2}$ in the PS memory $103_m''$ and supplied with the power-supply voltage VSS during operations switches to a low-resistance state in the PS $101_{11}$. As a result, the PS $101_{11}$ switches to the closed state; and the configuration memory $100_{121}$ determined to be defective and the configuration memories $100_{111}$ and $100_{131}$, which are connected to the PS $101_{11}$ along with the configuration memory $100_{121}$ are skipped.

Meanwhile, herein, the explanation is given under the assumption that the column-side write decoder 70 and the row-side write decoder 71 are embedded in the FPGA 3. However, that is not the only possible case. Alternatively, the column-side write decoder 70 and the row-side write decoder 71 can be treated as an external configuration of an FPGA. For example, the column-side write decoder 70 and the row-side write decoder 71 can be configured outside of an FPGA. Still alternatively, for example, the inspection device 400 can be configured to have the functions of the column-side write decoder 70 and the row-side write decoder 71.

Third Embodiment

Given below is the explanation of a third embodiment. The third embodiment is an example in which the FPGA 1 or the FPGA 2 according to the first embodiment and the modification examples of the first embodiment or the FPGA 3 according to the second embodiment is implemented in an electronic device.

Figure 23:
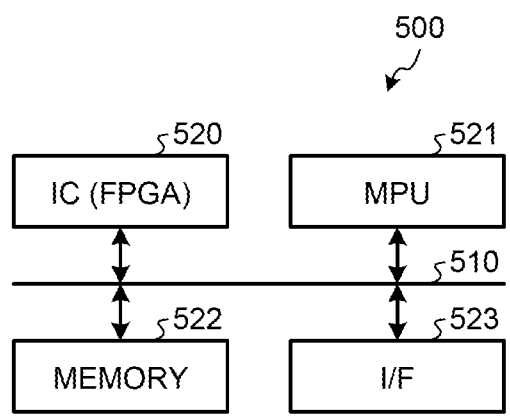
FIG. 23 is a block diagram illustrating an exemplary configuration of an electronic device according to a third embodiment.

In FIG. 23 is illustrated an exemplary configuration of an electronic device according to the third embodiment. With reference to FIG. 23, an electronic device 500 includes an IC (Integrated Circuit) 520, an MPU (Micro-Processing Unit) 521, a memory 522, and an interface (I/F) 523 that are connected to a bus 510.

The IC 520 represents the FPGA 1 or the FPGA 2 according to the first embodiment and the modification examples of the first embodiment or the FPGA 3 according to the second embodiment. Herein, it is assumed that the IC 520 represents the FPGA 1. As explained with reference to FIG. 1, the FPGA 1 includes a plurality of basic tiles 10 each including the SB 20 and the LB 21; and includes a plurality of I/Os 11 for communicating data with the outside.

The MPU 521 performs operations according to a program. The memory 522 is used to store in advance the program written for making the MPU 521 perform operations. Moreover, the memory 522 can also be used as a work memory during the operations performed by the MPU 521. The interface 523 performs communication with an external device under the control of the MPU 521.

Regarding the IC 520, for example, at the time of product shipment, inspection is performed with respect to the programmable switches and the configuration memories included in the IC 520. Then, as explained in the first embodiment, the first modification example of the first embodiment, and the second embodiment; according to the inspection result, a writing operation with respect to each programmable switch is performed so as to skip the configuration memory determined to be defective. Moreover, as described in the second modification example of the first embodiment, depending on the inspection result for each programmable switch, a writing operation is performed so as to disable a set of configuration memories. In addition, a writing operation is performed with respect to the internal configuration memories so as to implement a configuration for performing predetermined operations.

For example, if the program being executed requires the IC 520 to perform arithmetic processing, then the MPU 521 transfers a command and data to the IC 520 via the bus 510, and makes the IC 520 perform arithmetic processing. The result of arithmetic processing performed by the IC 520 is then transferred to the MPU 521 via the bus 510. The MPU 521 outputs the execution result of the program to the outside via, for example, the interface 523.

As described above, the electronic device 500 according to the third embodiment can hold down the percent defective of the IC 520 representing the FPGA 1, the FPGA 2, or the FPGA 3. That enables achieving reduction in the manufacturing cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reconfigurable semiconductor integrated circuit comprising:
   a plurality of memories connected in parallel;
   a logic circuit whose logic is defined according to data output of one of the memories;
   a signal output unit including a plurality of output terminals corresponding to the respective memories, each output terminal outputting either a selection signal for enabling the data output or a non-selection signal for disabling the data output to the logic circuit, the signal output unit being configured to output the selection signal in a cyclic manner over the output terminals so that one of the output terminals outputs the selection signal and the others output the non-selection signal; and
   a switching unit configured to set a route between a first output terminal of the output terminals and a second output terminal of the output terminals either to an open state or a closed state, the route bypassing at least a single output terminal.

2. The reconfigurable semiconductor integrated circuit according to claim 1, wherein
   the switching unit includes
   a first writing unit whose one end is connected to a first power supply, the first writing unit coming to, by writing, a state where a resistance between the one end and another end of the first writing unit is lower than that prior to the writing,
   a second writing unit whose one end is connected to a second power supply and whose another end is connected to the another end of the first writing unit via a connection point, the second writing unit coming to, by writing, a state where a resistance between the one end and the another end of the second writing unit is lower than that prior to the writing, and
   a first switching element configured to open and close connection between the first output terminal and the second output terminal according to voltage at the connection point.

3. The reconfigurable semiconductor integrated circuit according to claim 2, wherein
   the switching unit further includes a second switching element configured to open and close connection between the connection point and a third power supply, and
   when a voltage equal to or greater than a threshold value for the writing is supplied to one of the first writing unit and the second writing unit, when a voltage smaller than the threshold value is supplied to the other of the first writing unit and the second writing unit, and when the second switching element is set to close, either the first writing unit or the second writing unit that is supplied with the voltage equal to or greater than the threshold value comes to the state where the resistance is lower.

4. The reconfigurable semiconductor integrated circuit according to claim 3, wherein
   the switching unit further includes a third switching element inserted in between the connection point and the first switching element, and
   when the voltage equal to or greater than the threshold value for the writing is applied to one of the first writing unit and the second writing unit, when the voltage smaller than the threshold value is applied to the other of the first writing unit and the second writing unit, and when the second switching element is set to close, the third switching element is set to open.

5. The reconfigurable semiconductor integrated circuit according to claim 4, wherein
the switching unit includes
a fourth switching element inserted in between the first power supply and the one end of the first writing unit, and
a fifth switching element inserted in between the second power supply and the one end of the second writing unit, and
when the first writing unit connected to the fourth switching element and the second writing unit connected to the fifth switching element are not selected as targets for writing, the fourth switching element and the fifth switching element is set to open.

6. The reconfigurable semiconductor integrated circuit according to claim 1, wherein
a plurality of sets of the memories are provided,
the reconfigurable semiconductor integrated circuit further comprises a controller configured to set an enabled state or a disabled state for each of the memories corresponding to the respective output terminals in each set, and
the controller is configured to store, in a nonvolatile manner, the enabled state or the disable state set for each of the output terminals.

7. The reconfigurable semiconductor integrated circuit according to claim 1, wherein the switching unit is configured to store, in a nonvolatile manner, the open state or the closed state of the route.

8. An electronic device comprising:
a reconfigurable semiconductor integrated circuit including
a plurality of memories connected in parallel,
a logic circuit whose logic is defined according to data output of one of the memories,
a signal output unit including a plurality of output terminals corresponding to the respective memories, each output terminal outputting either a selection signal for enabling the data output or a non-selection signal for disabling the data output to the logic circuit, the signal output unit being configured to output the selection signal in a cyclic manner over the output terminals so that one of the output terminals outputs the selection signal and the others output the non-selection signal, and
a switching unit configured to set a route between a first output terminal of the output terminals and a second output terminal of the output terminals either to an open state or a closed state, the route bypassing at least a single output terminal;
a storage configured to store a program; and
a processor configured to perform a predetermined process for the reconfigurable semiconductor integrated circuit according to the program stored in the storage.

9. A reconfigurable semiconductor integrated circuit comprising:
a plurality of memories connected in parallel;
a logic circuit whose logic is defined according to data output of one of the memories;
a signal output unit including a plurality of output terminals corresponding to the respective memories, each output terminal outputting either a selection signal for enabling the data output or a non-selection signal for disabling the data output to the logic circuit, the signal output unit being configured to output the selection signal in a cyclic manner over the output terminals so that one of the output terminals outputs the selection signal and the others output the non-selection signal;
a switching unit configured to set a route between a first output terminal of the output terminals and a second output terminal of the output terminals either to an open state or a closed state, the route bypassing at least a single output terminal; and
a setting unit configured to fixedly set the switching unit to at least the closed state.

10. The reconfigurable semiconductor integrated circuit according to claim 9, wherein
the switching unit includes
a first writing unit whose one end is connected to a first power supply, the first writing unit coming to, by writing, a state where a resistance between the one end and another end of the first writing unit is lower than that prior to the writing,
a second writing unit whose one end is connected to a second power supply and whose another end is connected to the another end of the first writing unit via a connection point, the second writing unit coming to, by writing, a state where a resistance between the one end and the another end of the second writing unit is lower than that prior to the writing, and
a first switching element configured to open and close connection between the first output terminal and the second output terminal according to voltage at the connection point, and
the setting unit is configured to perform the writing with respect to either the first writing unit or the second writing unit.

11. The reconfigurable semiconductor integrated circuit according to claim 10, wherein
the switching unit further includes a second switching element configured to open and close connection between the connection point and a third power supply, and
the setting unit is configured to supply a voltage equal to or greater than a threshold value for the writing to one of the first writing unit and the second writing unit, supply a voltage smaller than the threshold value to the other of the first writing unit and the second writing unit, and set the second switching element to close so that either the first writing unit or the second writing unit that is supplied with the voltage equal to or greater than the threshold value comes to the state where the resistance is lower.

12. The reconfigurable semiconductor integrated circuit according to claim 11, wherein
the switching unit further includes a third switching element inserted in between the connection point and the first switching element, and
the setting unit is configured to supply the voltage equal to or greater than the threshold value for the writing to one of the first writing unit and the second writing unit, supply the voltage smaller than the threshold value to the other of the first writing unit and the second writing unit, set the second switching element to close, and set the third switching element to open.

13. The reconfigurable semiconductor integrated circuit according to claim 12, wherein
the switching unit includes
a fourth switching element inserted in between the first power supply and the one end of the first writing unit, and a fifth switching element inserted in between the second power supply and the one end of the second writing unit, and the setting unit is configured to, when the first writing unit connected to the fourth switching element and the second writing unit connected to the fifth switching element are not selected as targets for writing, set the fourth switching element and the fifth switching element to open.

14. The reconfigurable semiconductor integrated circuit according to claim 9, wherein a plurality of sets of the memories are provided, the reconfigurable semiconductor integrated circuit further comprises a controller configured to set an enabled state or a disabled state for each of the memories corresponding to the respective output terminals in each set, and the controller is configured to store, in a nonvolatile manner, the enabled state or the disable state set for each of the output terminals.

15. The reconfigurable semiconductor integrated circuit according to claim 9, wherein the switching unit is configured to store, in a nonvolatile manner, the open state or the closed state of the route.

* * * * *